(12) United States Patent
Chang et al.

(10) Patent No.: US 11,437,278 B2
(45) Date of Patent: Sep. 6, 2022

(54) METHOD FOR FORMING SEMICONDUCTOR DEVICE

(71) Applicant: TAIWAN SEMICONDUCTOR MANUFACTURING CO., LTD., Hsinchu (TW)

(72) Inventors: Chang-Yun Chang, Taipei (TW); Bone-Fong Wu, Hsinchu (TW); Ming-Chang Wen, Kaohsiung (TW); Ya-Hsiu Lin, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/985,174

(22) Filed: Aug. 4, 2020

(65) Prior Publication Data

US 2020/0365465 A1 Nov. 19, 2020

Related U.S. Application Data

(62) Division of application No. 15/892,593, filed on Feb. 9, 2018, now Pat. No. 10,741,450.

(60) Provisional application No. 62/592,843, filed on Nov. 30, 2017.

(51) Int. Cl.
| *H01L 21/8234* | (2006.01) |
| *H01L 21/311* | (2006.01) |
| *H01L 29/08* | (2006.01) |
| *H01L 21/02* | (2006.01) |
| *H01L 27/088* | (2006.01) |
| *H01L 29/06* | (2006.01) |
| *H01L 29/66* | (2006.01) |
| *H01L 21/324* | (2006.01) |
| *H01L 21/762* | (2006.01) |
| *H01L 21/3105* | (2006.01) |

(Continued)

(52) U.S. Cl.
CPC .. *H01L 21/823431* (2013.01); *H01L 21/0217* (2013.01); *H01L 21/02156* (2013.01); *H01L 21/31111* (2013.01); *H01L 21/823418* (2013.01); *H01L 21/823437* (2013.01); *H01L 21/823481* (2013.01); *H01L 27/0886* (2013.01); *H01L 29/0649* (2013.01); *H01L 29/0847* (2013.01); *H01L 29/66545* (2013.01); *H01L 21/0274* (2013.01); *H01L 21/26513* (2013.01); *H01L 21/31053* (2013.01); *H01L 21/324* (2013.01); *H01L 21/76224* (2013.01); *H01L 29/6656* (2013.01)

(58) Field of Classification Search
None
See application file for complete search history.

(56) References Cited

U.S. PATENT DOCUMENTS

| 9,331,074 | B1 | 5/2016 | Chang et al. |
| 10,084,053 | B1 * | 9/2018 | Xie ................ H01L 21/28176 |
| 2017/0229451 | A1 | 8/2017 | Chang et al. |

(Continued)

*Primary Examiner* — Nilufa Rahim
(74) *Attorney, Agent, or Firm* — Maschoff Brennan

(57) ABSTRACT

A method of forming a semiconductor device includes forming a gate structure over first and second fins over a substrate; forming an interlayer dielectric layer surrounding first and second fins; etching a first trench in the interlayer dielectric layer between the first and second fins uncovered by the gate structure; forming a helmet layer lining the first trench; and forming a dielectric feature in the first trench.

20 Claims, 25 Drawing Sheets

(51) Int. Cl.
*H01L 21/027* (2006.01)
*H01L 21/265* (2006.01)

(56) References Cited

U.S. PATENT DOCUMENTS

2017/0317084 A1  11/2017  Cantoro et al.
2017/0338323 A1  11/2017  Cheng et al.

* cited by examiner

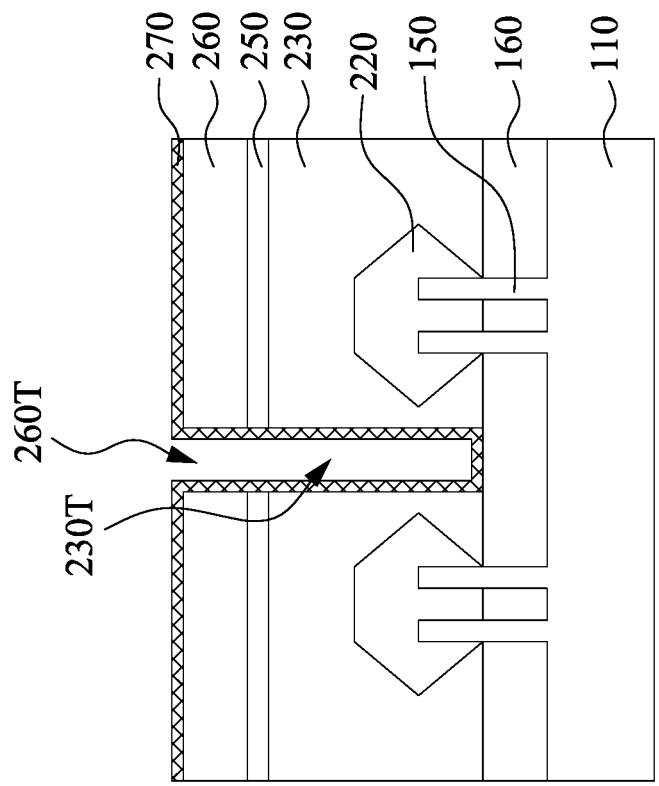
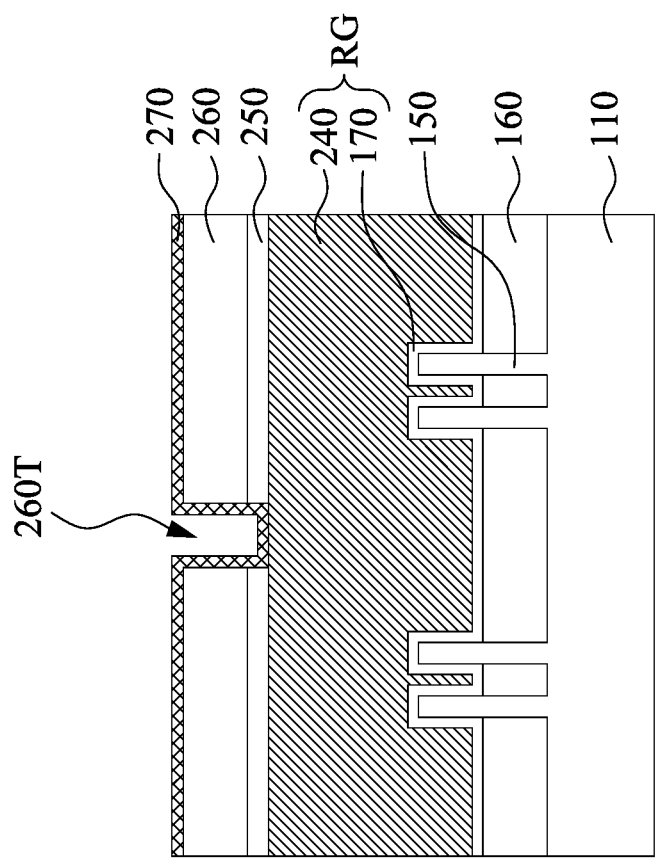
Fig. 15B
Fig. 15A

US 11,437,278 B2

METHOD FOR FORMING SEMICONDUCTOR DEVICE

PRIORITY CLAIM AND CROSS-REFERENCE

This application is a divisional application of U.S. patent application Ser. No. 15/892,593, filed Feb. 9, 2018, now U.S. Pat. No. 10,741,450, issued Aug. 11, 2020, which claims priority of U.S. Provisional Application Ser. No. 62/592,843, filed Nov. 30, 2017, the entirety of which is incorporated by reference herein in their entireties.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 19C illustrate a method for manufacturing a semiconductor device at various stages in accordance with some embodiments of the present disclosure.

DETAILED DESCRIPTION

Figure 1:
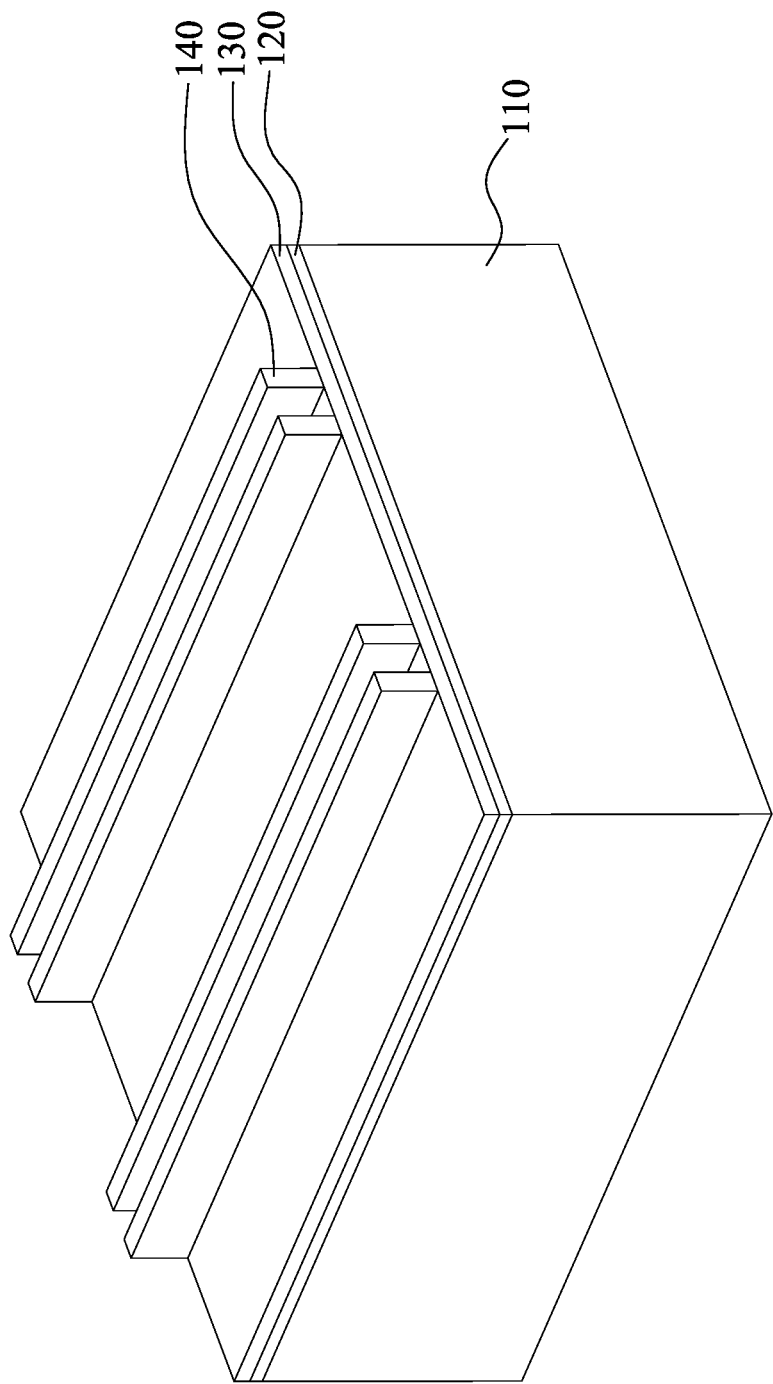

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 19C illustrate a method for manufacturing a semiconductor device at various stages in accordance with some embodiments of the present disclosure. Reference is made to FIG. 1. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 2:
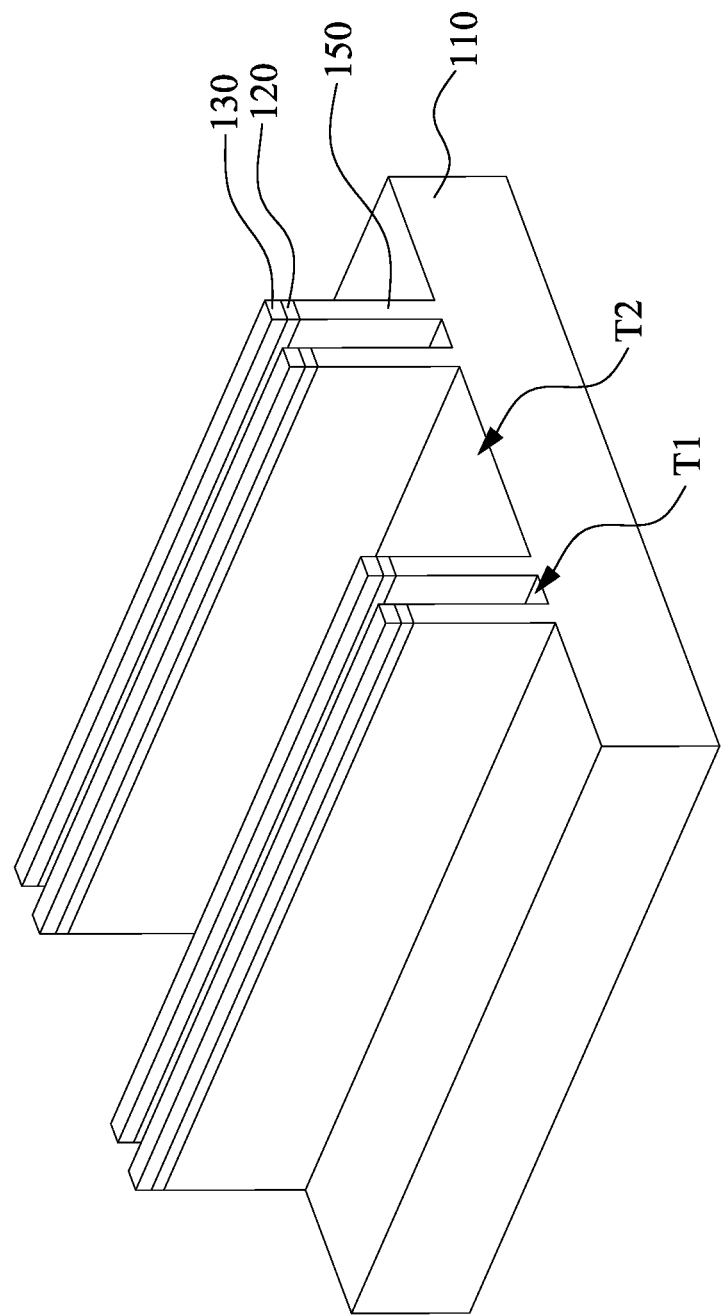

Reference is made to FIG. 2. The mask layer 130 and pad layer 120 are etched through the photo-sensitive layer 140, exposing underlying substrate 110. The exposed substrate 110 is then etched, forming trenches T1 and T2. A portion of the substrate 110 between neighboring trenches T1 and T2 can be referred to as a semiconductor fin 150. Trenches T1 and T2 may be trench strips that are substantially parallel to each other. Similarly, the semiconductor fins 150 are substantially parallel to each other. In some embodiments, the trenches T1 is wider than the trenches T2, such that there are different pitches between the semiconductor fins 150. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
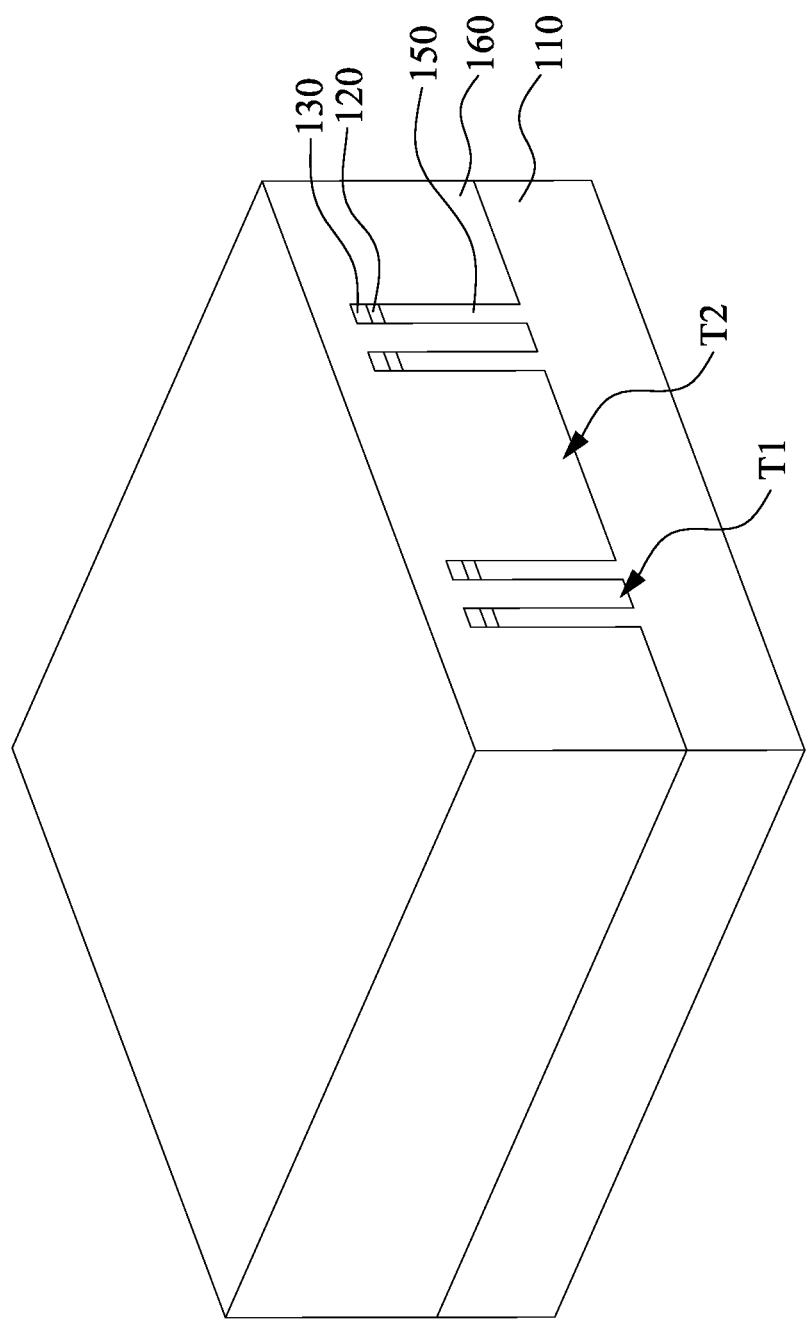

After photo-sensitive layer 140 is removed, an isolation dielectric 160 is formed to surround the semiconductor fin 150 over substrate 110. The isolation dielectric 160 may overfill the trenches T1 and T2, and the resulting structure is shown in FIG. 3. The isolation dielectric 160 in the trenches T1 and T2 can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 4:
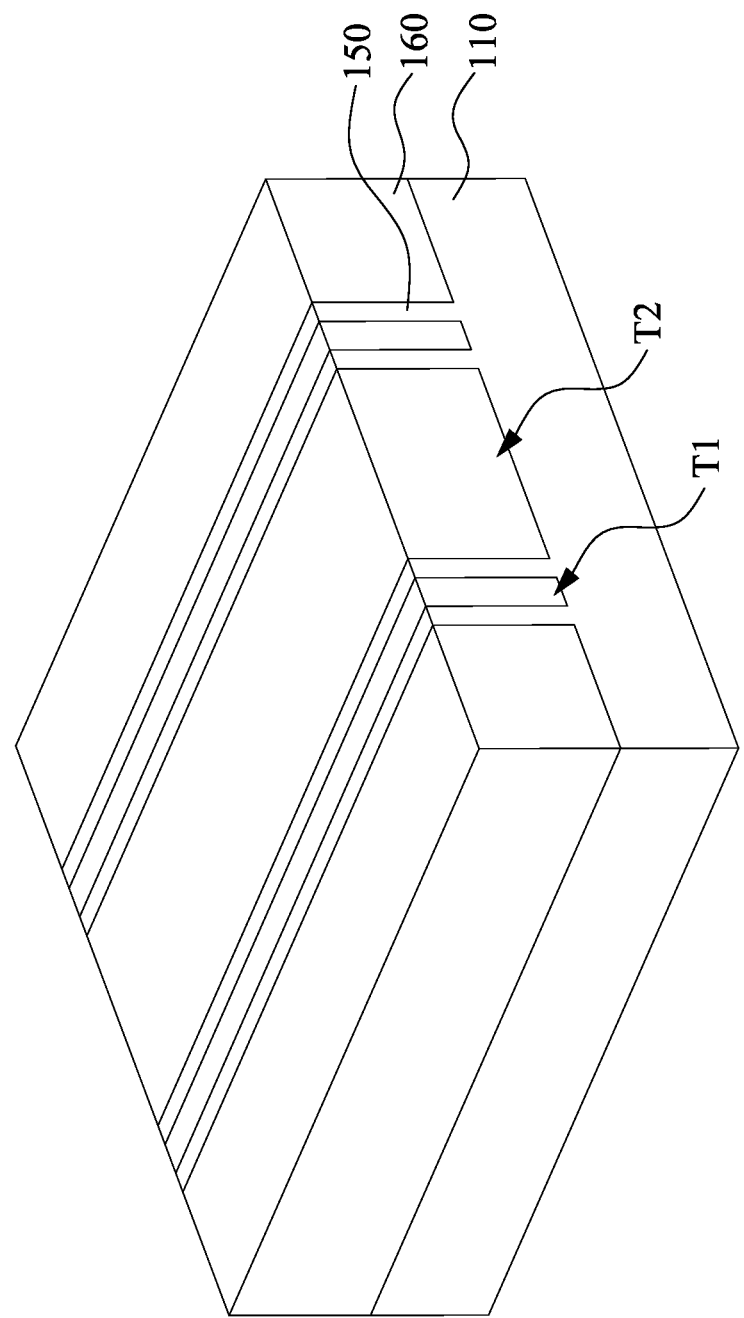

Next, a planarization process such as chemical mechanical polish (CMP) is then performed to remove the excess isolation dielectric 160 outside the trenches T1 and T2, and the resulting structure is shown in FIG. 4. In some embodiments, the planarization process may also remove the mask layer 130 and the pad layer 120 such that top surfaces of the semiconductor fins 150 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 5:
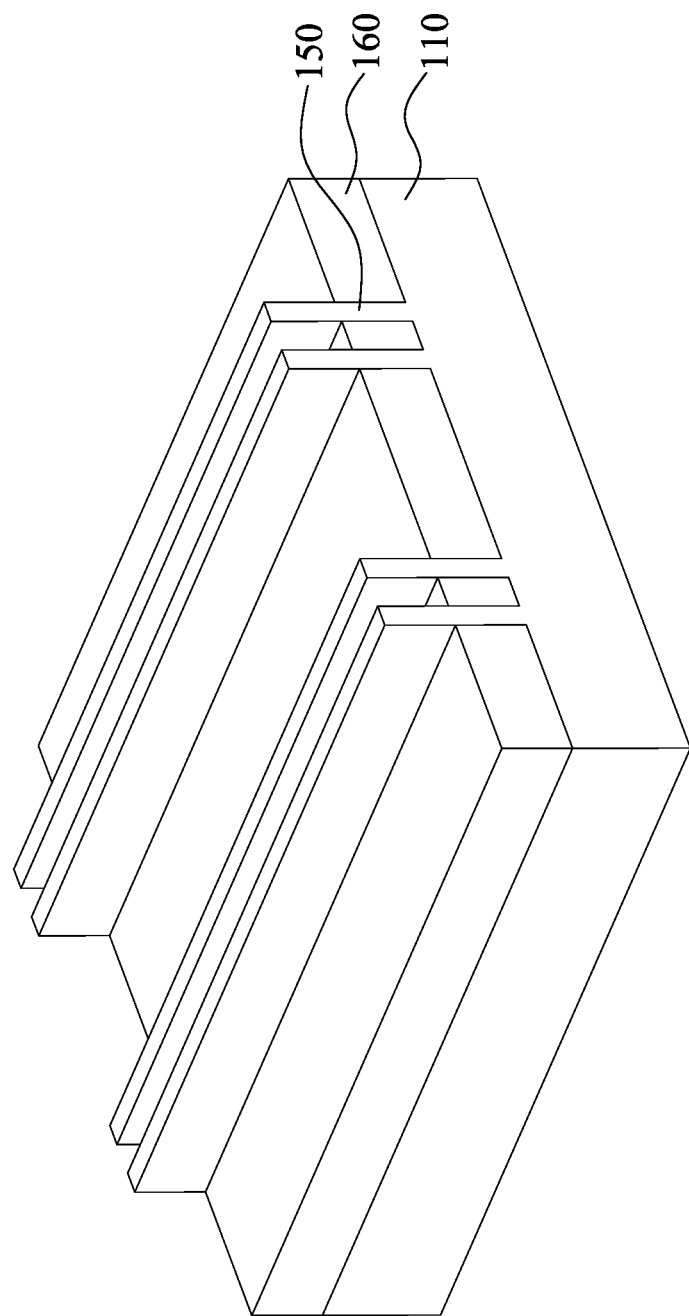

Next, as shown in FIG. 5, the isolation dielectric 160 is recessed, for example, through an etching operation, wherein diluted HF, SiCoNi (including HF and $NH_3$), or the like, may be used as the etchant. After recessing the isolation dielectric 160, a portion of the semiconductor fin 150 is higher than a top surface of the isolation dielectric 160, and hence this portion of the semiconductor fin 150 protrudes above the isolation dielectric 160.

It is understood that the processes described above are some examples of how semiconductor fins 150 and the STI structure are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 150 can be recessed, and a material different from the recessed semiconductor fin 150 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 150 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
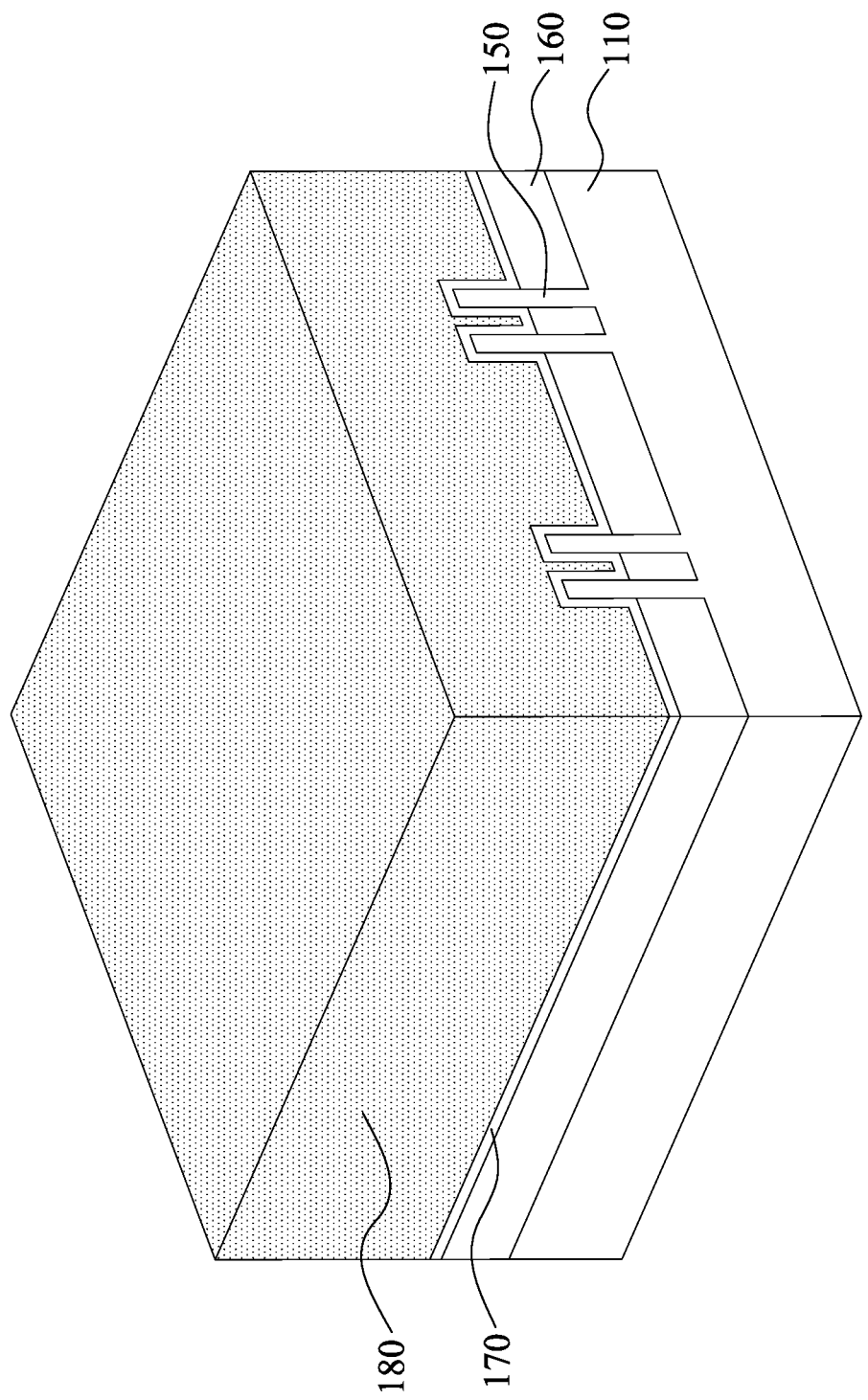

Reference is made to FIG. 6. A gate dielectric layer 170 is blanket formed over the substrate 110 to cover the semiconductor fins 150 and the isolation dielectric 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 7:
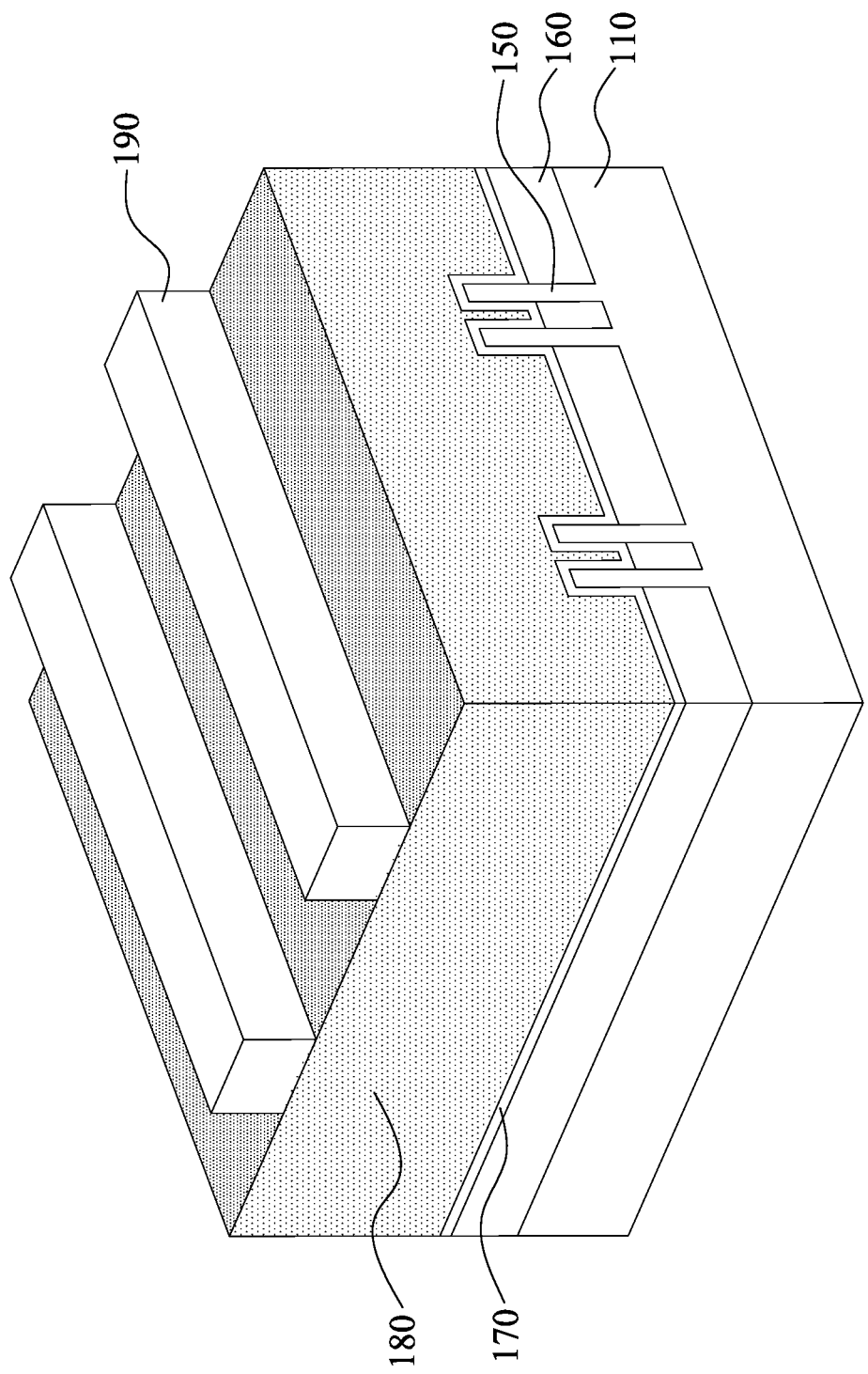

Next, the dummy gate electrode layer 180 and the gate dielectric layer 170 are patterned to form dummy gate structures in accordance with some embodiments. For example, a patterned mask 190 is formed over a portion of the dummy gate electrode layer 180, as shown in FIG. 7. The mask 190 may be a hard mask for protecting the underlying dummy gate electrode layer 180 and the gate dielectric layer 170 against subsequent etching process. The patterned mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 8:
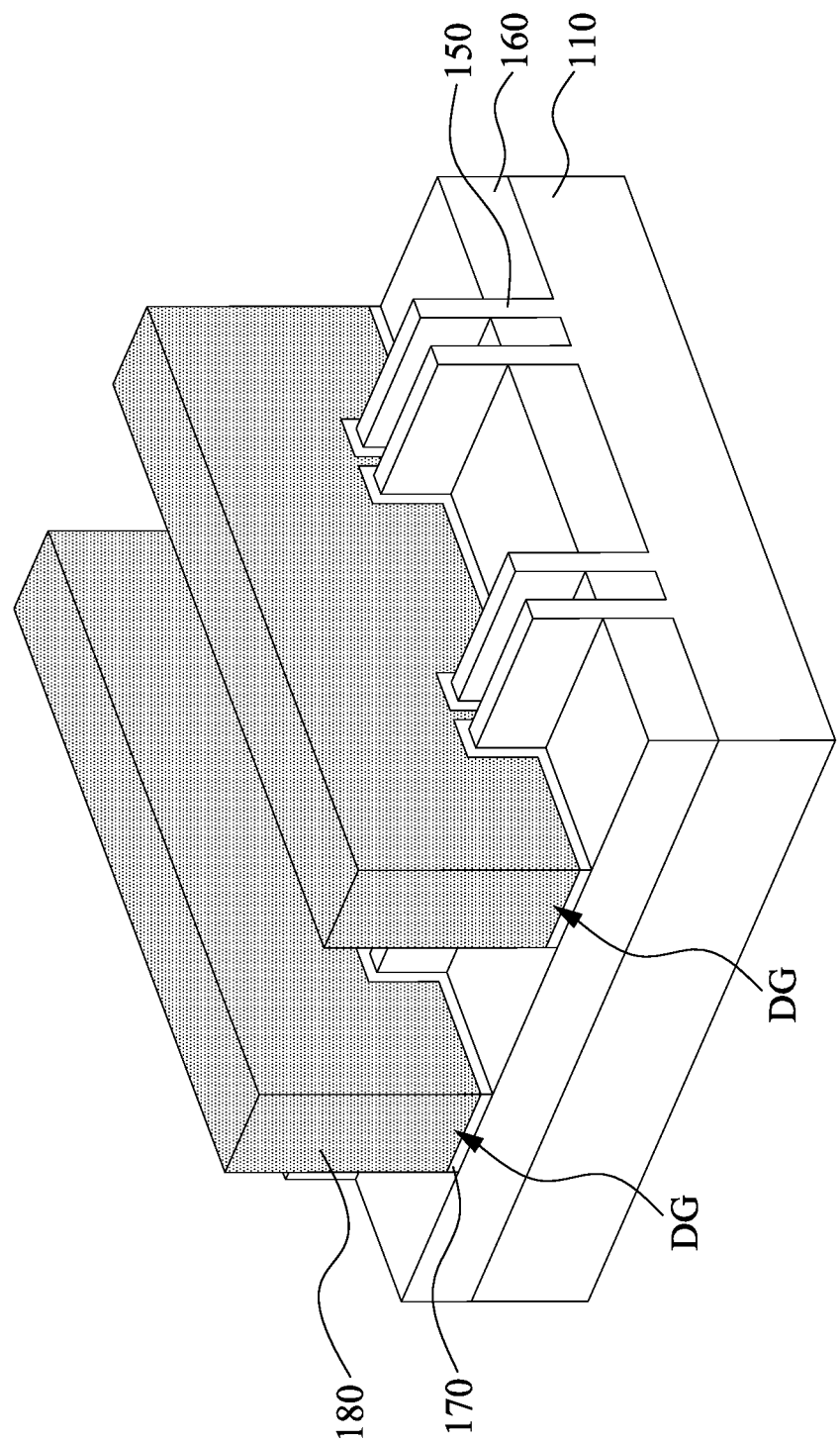

An etching process is performed to form dummy gate structures DG wrapping the semiconductor fins 150 using the patterned mask 190 as an etching mask, and the patterned mask 190 is removed after the etching. The resulting structure is shown in FIG. 8. Each dummy gate structure DG includes a gate dielectric layer 170 and a dummy gate electrode layer 180 over the gate dielectric layer 170. The dummy gate structures DG have substantially parallel longitudinal axes that are substantially perpendicular to longitudinal axes of the semiconductor fins 150, as illustrated in FIG. 8. The dummy gate structures DG will be replaced with a replacement gate structure using a "gate-last" or replacement-gate process.

Figure 9:
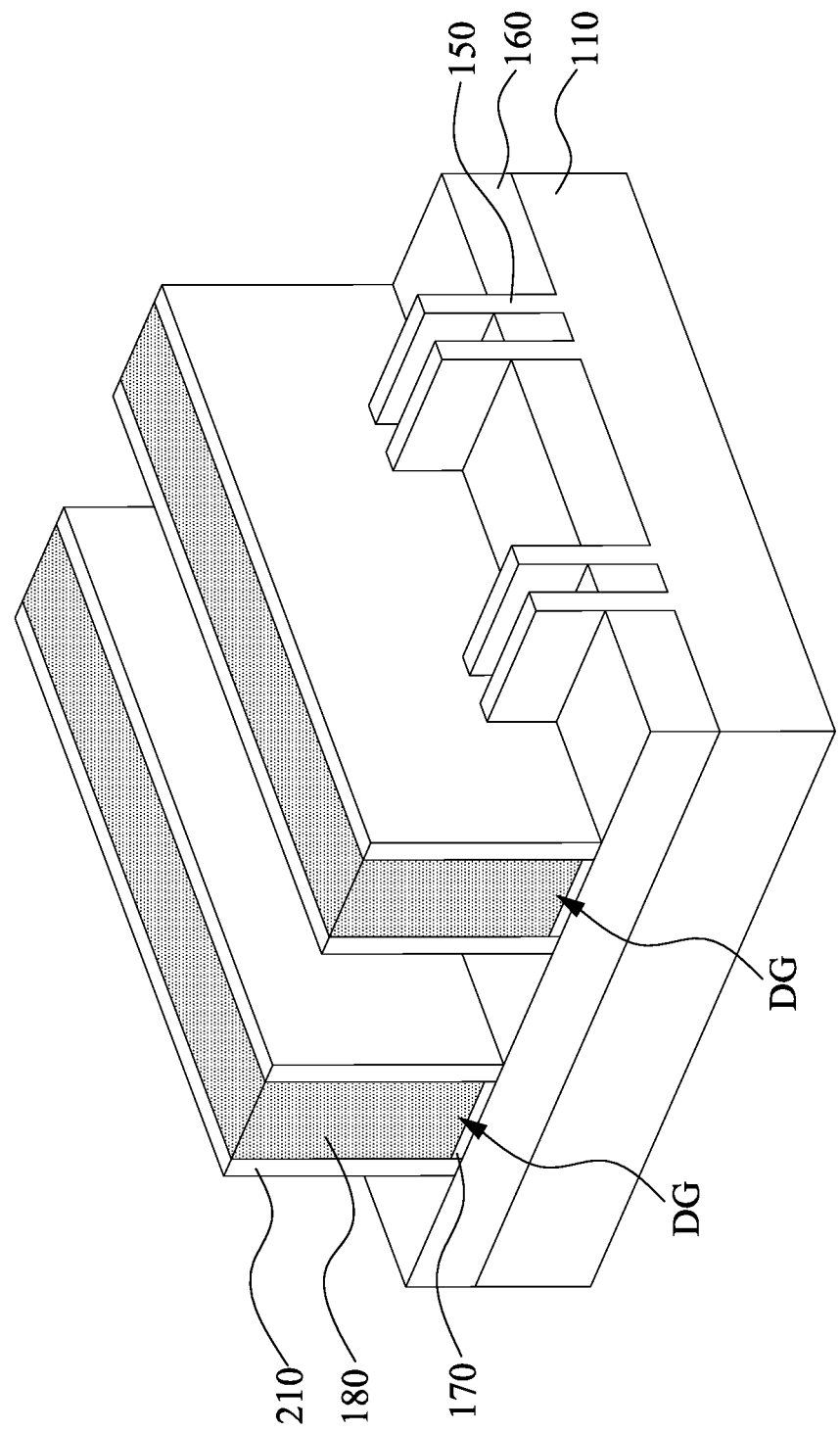

Reference is made to FIG. 9. Gate spacers 210 are formed on opposite sidewalls of the dummy gate structures DG. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials. The method of forming the gate spacers 210 includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on sidewalls of the dummy gate structures DG can serve as the gate spacers 210. In some embodiments, the gate spacers 210 may be used to offset subsequently formed doped regions, such as source/drain regions. The gate spacers 210 may further be used for designing or modifying the source/drain region profile.

Figure 10:
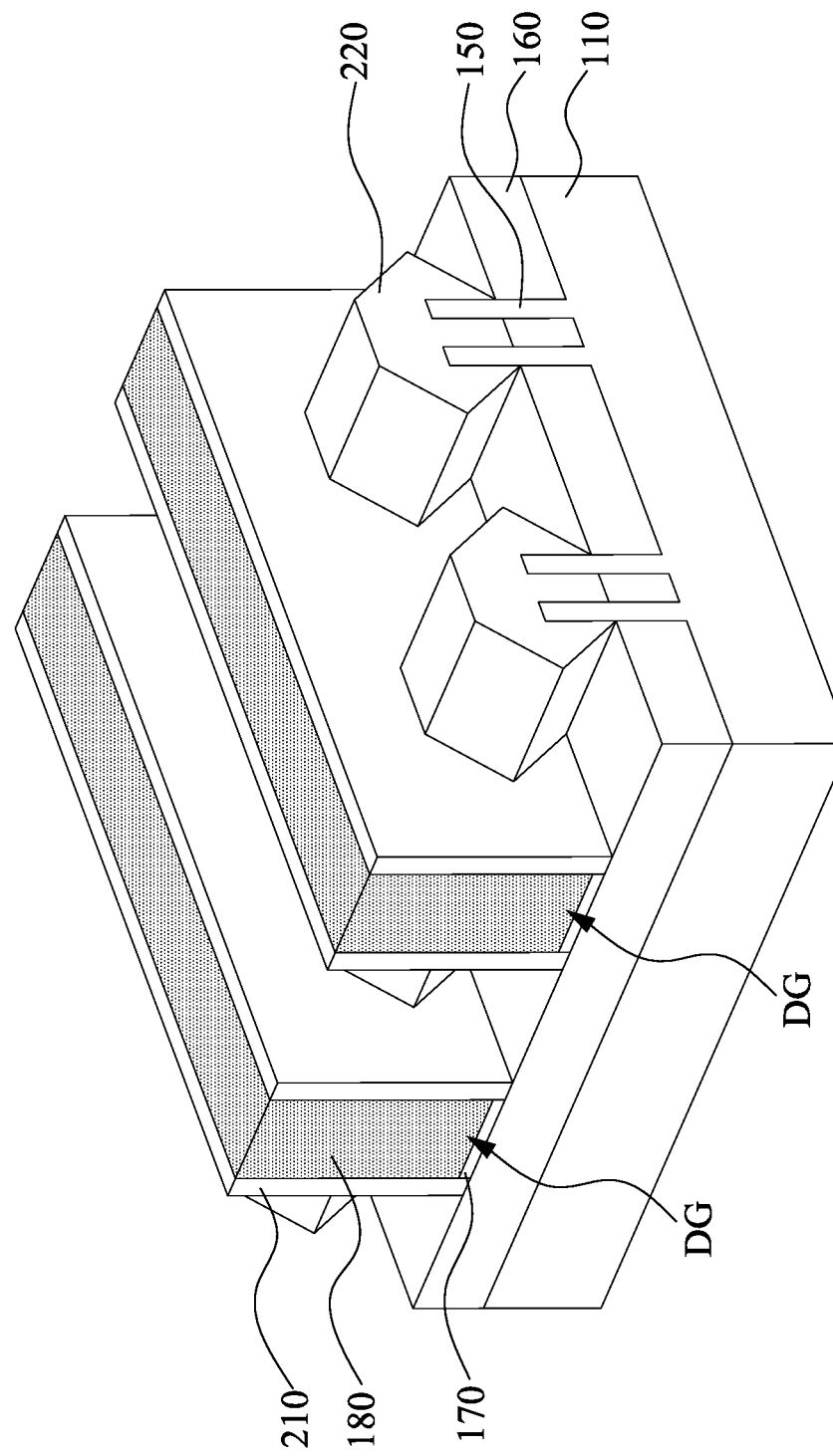

Reference is made to FIG. 10. Epitaxial source/drain structures 220 are respectively formed over portions of the semiconductor fins 150 not covered by the dummy gate structures DG. The epitaxial source/drain structures 220 may be formed using one or more epitaxy or epitaxial (epi) processes, such that Si features, SiGe features, silicon phosphate (SiP) features, silicon carbide (SiC) features and/or other suitable features can be epitaxially grown in a crystalline state from the exposed portions of the semiconductor fins 150, and thus the exposed semiconductor fins 150 are wrapped by the epitaxial source/drain structures 220.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 150 (e.g., silicon, silicon germanium, silicon phosphate, or the like). The epitaxial source/drain structures 220 may be in-situ doped. The doping species include p-type dopants, such as boron or $BF_2$; n-type dopants, such as phosphorus or arsenic; and/or other suitable dopants including combinations thereof. If the epitaxial source/drain structures 220 are not in-situ doped, a second implantation process (i.e., a junction implant process) is performed to dope the epitaxial source/drain structures 220. One or more annealing processes may be performed to activate the epitaxial source/drain structures 220. The annealing processes include rapid thermal annealing (RTA) and/or laser annealing processes.

In some embodiments, one or more epitaxy condition (e.g., epitaxial growth duration, and/or the flow rates of the gases used in the epitaxial growth) is controlled in such a way that epitaxial materials respectively grown from neighboring semiconductor fins 150 are merged. In this way, neighboring semiconductor fins 150 can be wrapped by a single continuous epitaxial source/drain structure 220, which in turn results in improved source/drain contact area and reduced source/drain contact resistance. However, merged epitaxial materials inevitably increase the volume of the epitaxial source/drain structures 220, which in turn would lead to raised risk of damage to the epitaxial source/drain structures 220 resulting from a cut metal gate (CMG) process performed at a later stage of fabrication. As a result, the present disclosure utilizes an additional helmet layer (e.g., layer 270 as illustrated in FIG. 15B) to protect the epitaxial source/drain structures 220 against the subsequent CMG process, which will be discussed in greater detail below.

Figure 11:
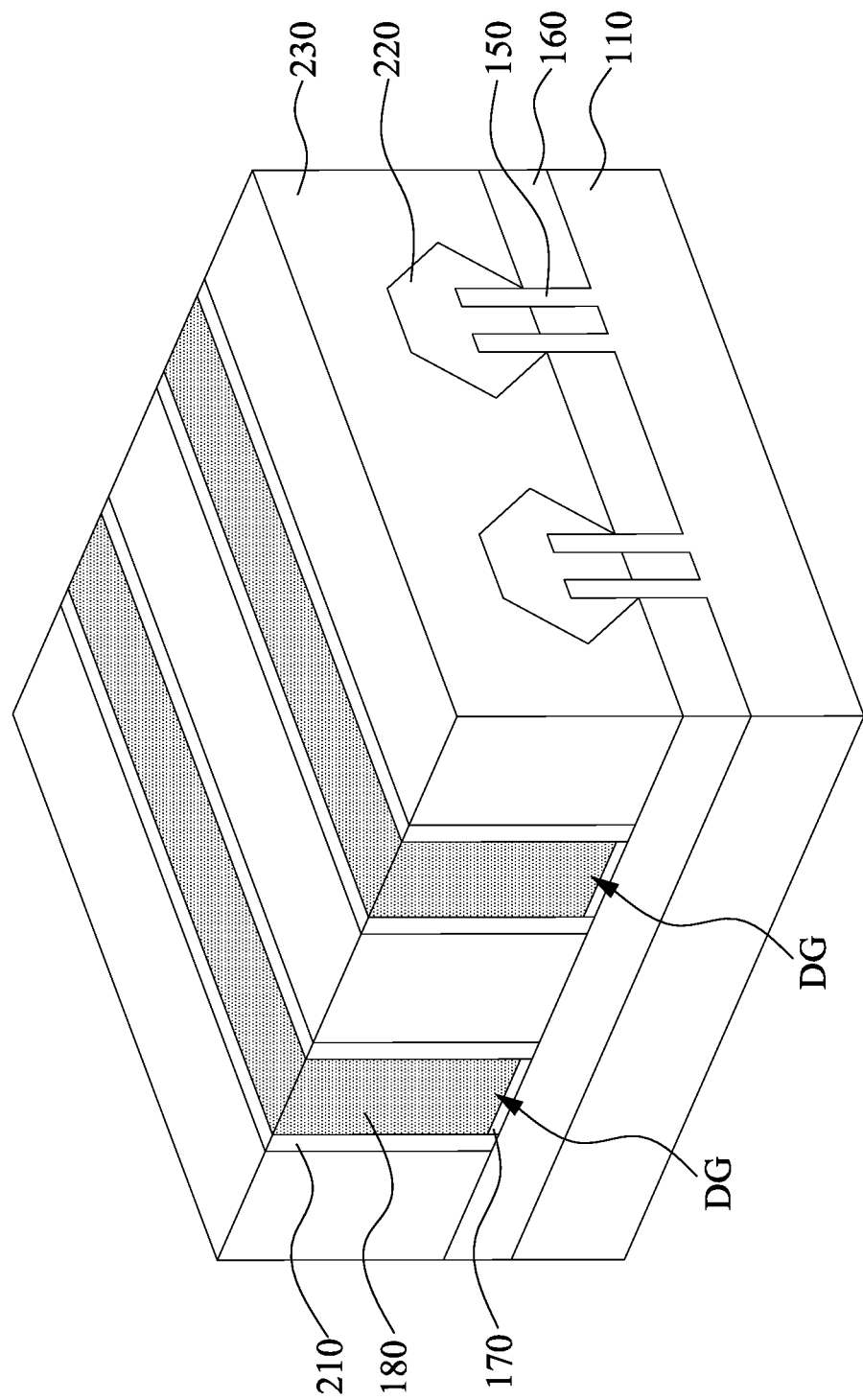

Reference is made to FIG. 11. An interlayer dielectric (ILD) layer 230 is formed on the structure shown in FIG. 11. Afterwards, a CMP process may be optionally performed to remove excessive material of the ILD layer 230 to expose the dummy gate structures DG. The CMP process may planarize a top surface of the ILD layer 230 with top surfaces of the dummy gate structures DG, and the gate spacers 210. In some embodiments, the ILD layer 230 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 230 may be formed using, for example, CVD, ALD, spin-on-glass (SOG) or other suitable techniques.

In some embodiments, a contact etch stop layer (CESL) may be optionally blanket formed on the structure shown in FIG. 10, and then the ILD layer 230 is formed over the CESL layer. That is, there is a CESL between the isolation dielectric 160 and the ILD layer 230 and between the epitaxial source/drain structures 220 and the ILD layer 230. The CESL may include a material different from the ILD layer 230. The CESL includes silicon nitride, silicon oxynitride or other suitable materials. The CESL can be formed using, for example, plasma enhanced CVD, low pressure CVD, ALD or other suitable techniques.

Figure 12:
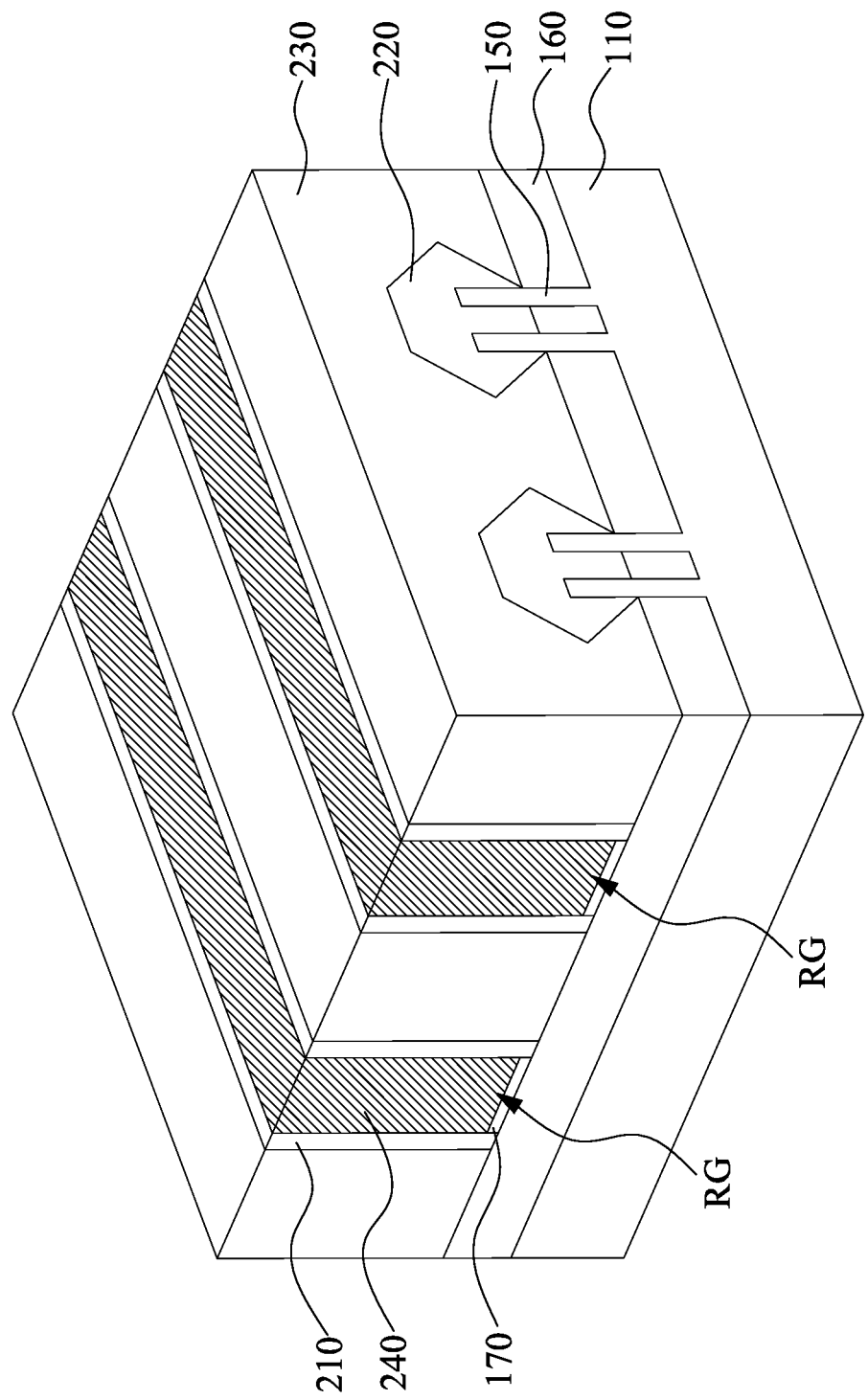

Reference is made to FIG. 12. The dummy gate structures DG are replaced by replacement gates structures RG. Herein, at least the dummy gate electrode layer 180 of the dummy gate structures DG are removed to leave gate trenches between the gate spacers 210, and then the replacement gates structures RG are formed in the gate trenches. The replacement gates structures RG may include a metal 240. The metal 240 includes, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the metal 240 is a single-layered structure or a multi-layered structure. In some embodiments, the metal 240 includes work function metals to provide a suitable work function for the conductive metal. In some embodiments, the work function conductive layer may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the work function conductive layer is formed by ALD process.

In some other embodiments where the gate dielectric layer 170 is also removed during the removal of the dummy gate structures DG, the replacement gates structures RG further includes a layer of gate dielectric (e.g., high-k gate dielectric layer with a dielectric constant greater than about 3.9) formed over the structures of FIG. 11 and into the gate trenches to resemble a U-shape profile, followed by depositing the work function conductive layer and the conductive layer over the gate dielectric layer.

Figure 13A:
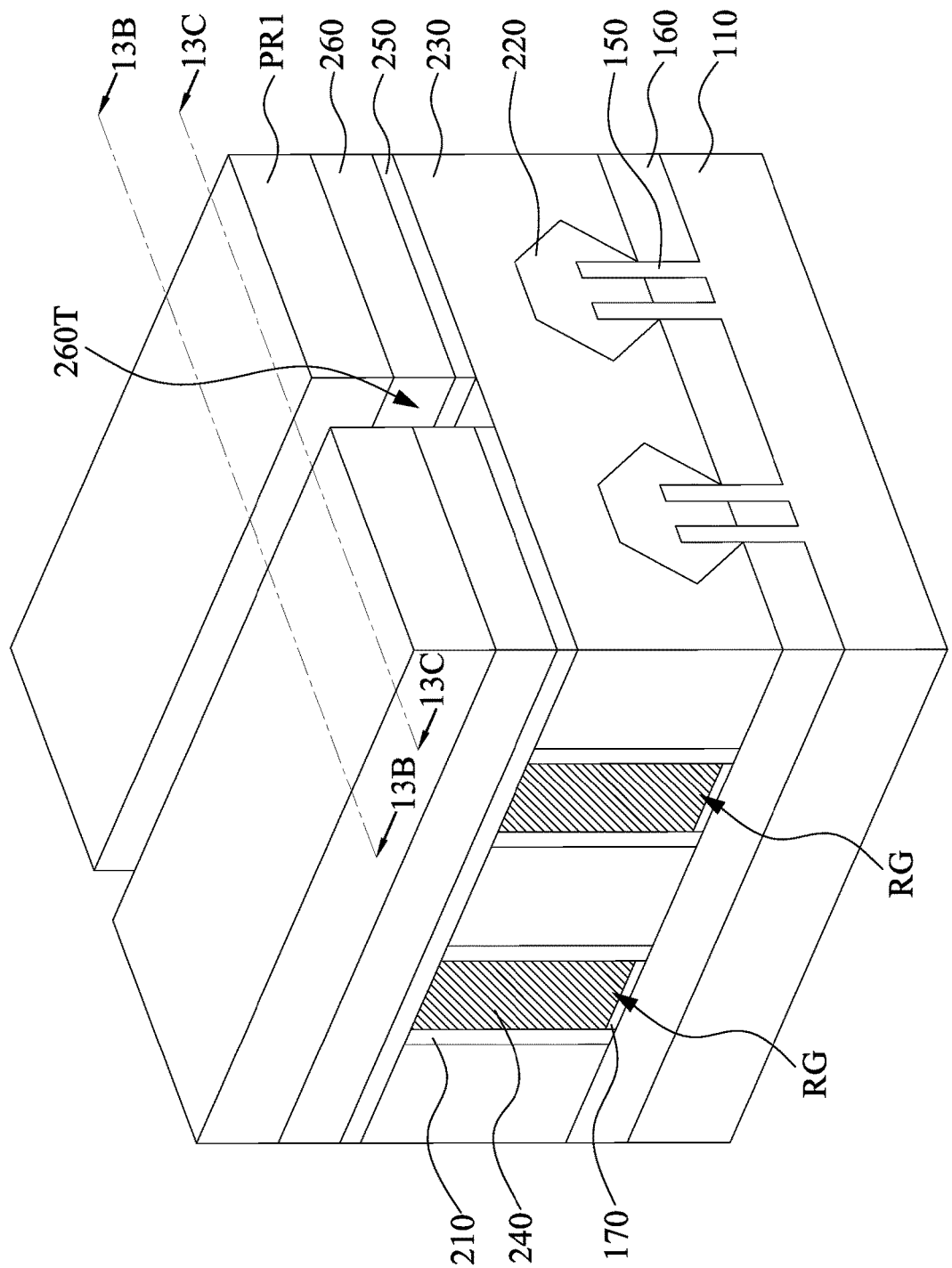
Figure 13C:
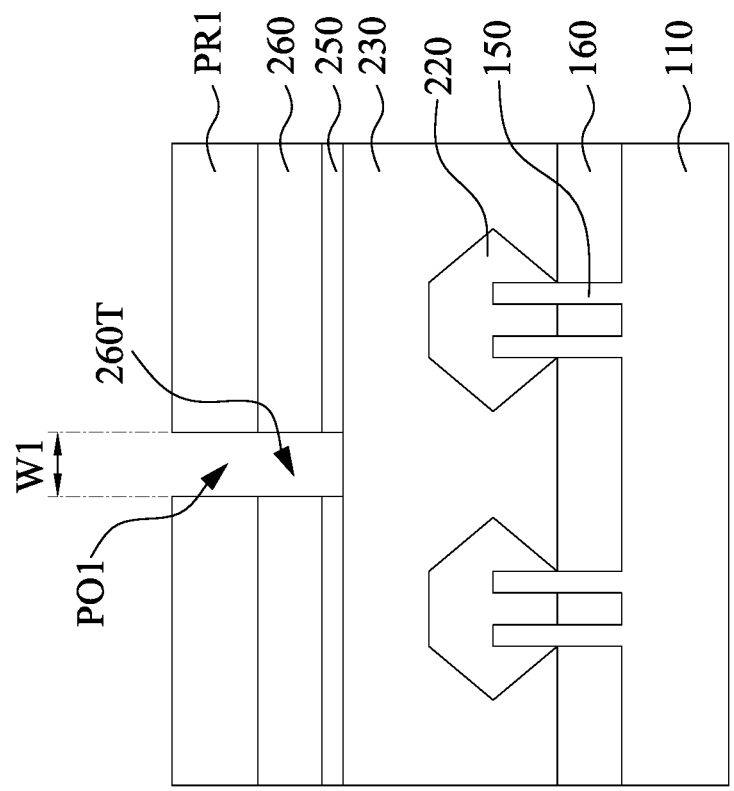
Figure 13B:
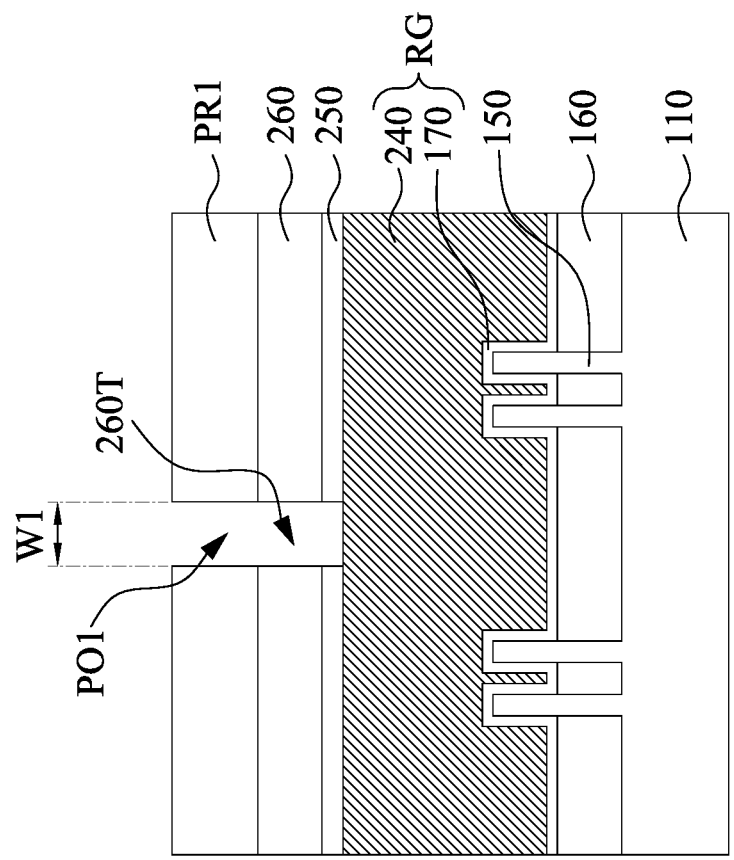

Reference is made to FIGS. 13A-13C, where FIG. 13A is a schematic view of the semiconductor device according with some embodiments, FIG. 13B is a cross-sectional view taking along line 13B-13B of FIG. 13A, and FIG. 13C is a cross-sectional view taking along line 13C-13C of FIG. 13A. Herein, a pad layer 250 and a hard mask layer 260 are formed on the structure shown in FIG. 12. The pad layer 250 may act as an adhesion layer between the ILD layer 230 and the hard mask layer 260. The pad layer 250 may also act as an etch stop layer for etching the hard mask layer 260. In some embodiments, the hard mask layer 260 is silicon nitride formed using, for example, low-pressure chemical vapor deposition (LPCVD) or plasma enhanced chemical vapor deposition (PECVD).

The hard mask layer 260 and underlying pad layer 250 are patterned using a patterned photo-sensitive layer PR1. For example, a layer of photo-sensitive material can be coated on a blanket stack layer of hard mask material (e.g., silicon nitride) and pad material (e.g., silicon oxide), and then be patterned, using suitable photolithography techniques, as the photo-sensitive layer PR1 with one or more openings PO1. Afterwards, a portion of the blanket stack layer exposed by the one or more openings PO1 is removed to form one or more trenches 260T in the blanket stack layer, resulting in formation of the patterned hard mask layer 260 and patterned pad layer 250 with one or more trenches 260T. In some embodiments, after forming the patterned hard mask layer 260 and the patterned pad layer 250, the photo-sensitive layer PR1 may be removed using, for example, ashing.

Figure 14B:
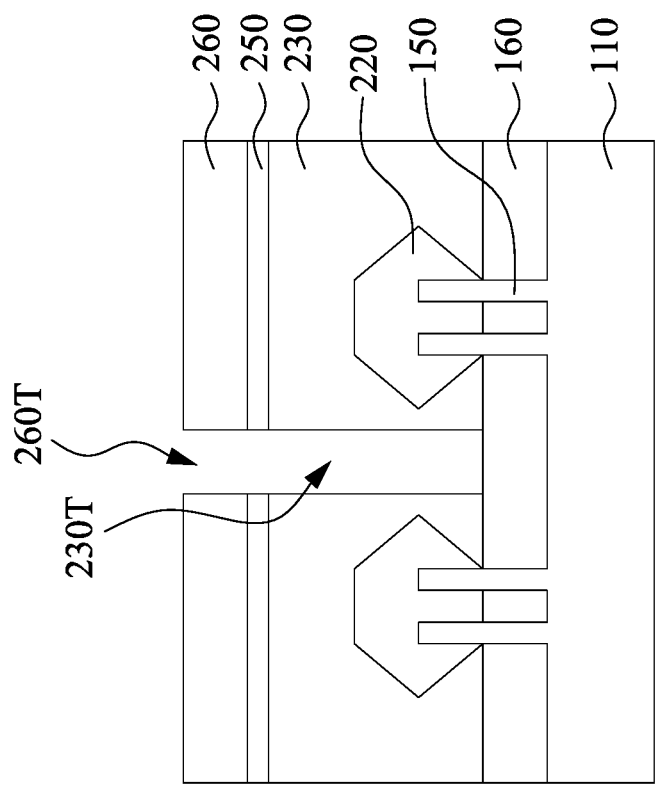
Figure 14A:
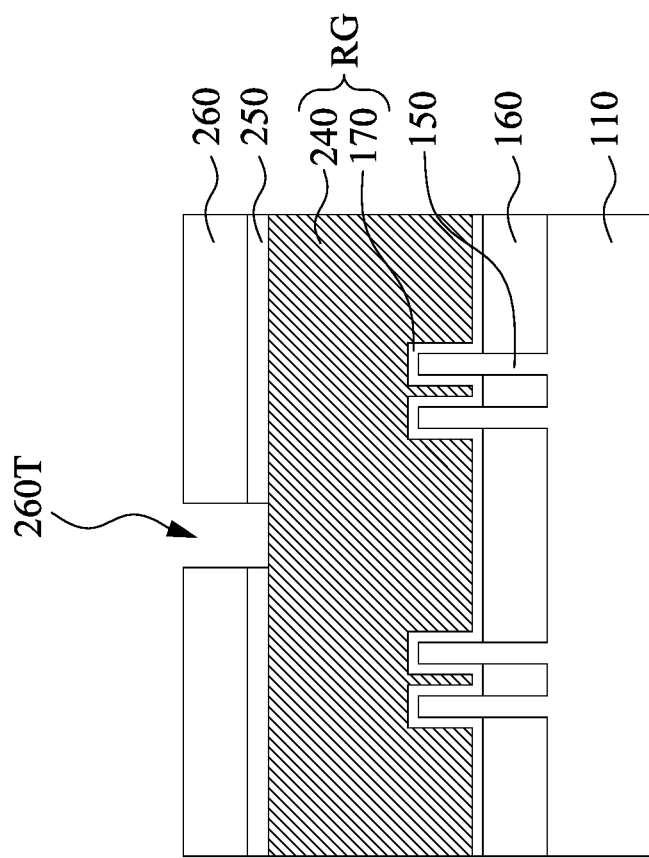

Reference is made to FIGS. 14A and 14B, where the cross-sectional position of FIG. 14A is the same as the cross-sectional position of FIG. 13B, and the cross-sectional position of FIG. 14B is the same as the cross-sectional position of FIG. 13C. With the pattern of the hard mask layer 260 including the one or more trenches 260T is created, one or more trenches 230T corresponding to the one or more trenches 260T are etched into the ILD layer 230. The trench 230T of the ILD layer 230 is between the epitaxial source/drain structures 220. In some embodiments, the trench 230T may reach the isolation dielectric 160.

Herein, the metal 240 has a higher etch resistance to the etching process of creating the trench 230T than that of the ILD layer 230, and therefore the metal 240 remains substantially intact during the etching process. The etching process may be an anisotropic etching process using etchant gas with high selectivity between the metal 240 and the ILD layer 230, so as to forming the trench 230T while keep the metal substantially intact. Moreover, the etchant gas is further selected to have light molecular weight compared with etchant gas used in the later CMG process. For example, the etchant gas with the light molecular weight includes, for example, fluoride-containing gases (e.g., $CF_4$, $SF_6$, $CH_2F_2$, $CHF_3$, and/or $C_2F_6$). The use of the etchant gas with the light molecular weight reduces undesired lateral etching and keeps the sidewall profile of the ILD layer 230 smooth and straight while it is etched. As a result, the trenches 230T may be accurately formed between the epitaxial source/drain structures 220 while keep the epitaxial source/drain structures 220 substantially intact, which in turn will resulting in reduced damage to the epitaxial source/drain structures 220 during fabrication of the semiconductor device. In greater detail, there are still portions of the ILD layer 230 remaining between sides of the epitaxial source/drain structures 220 and the trenches 230T, and thus the epitaxial source/drain structures 220 are not etched during forming the trenches 230T. In some other embodiments, after forming the trenches 230T, the epitaxial source/drain structures 220 are exposed to the trenches 230T. In some other embodiments, the epitaxial source/drain structures 220 are etched during forming the trenches 230T.

Reference is made to FIGS. 15A and 15B, where the cross-sectional position of FIG. 15A is the same as the cross-sectional position of FIG. 13B, and the cross-sectional position of FIG. 15B is the same as the cross-sectional position of FIG. 13C. A helmet layer 270 is blankly formed on the structure shown in FIGS. 14A and 14B. The helmet layer 270 covers sidewalls of the trenches 230T of the ILD layer 230 and sidewalls of the trenches 260T of the patterned hard mask layer 260. The helmet layer 270 may be made of SiN, $YSiO_x$, other suitable metalized compounds, or combination thereof. Herein, due to the substantially intact replacement gate structure RG, the helmet layer 270 is not formed between the fins 150 covered by the gate structure RG. In some embodiments, a thickness of the helmet layer 270 may be in a range of 2 to 10 nanometers.

Figure 16B:
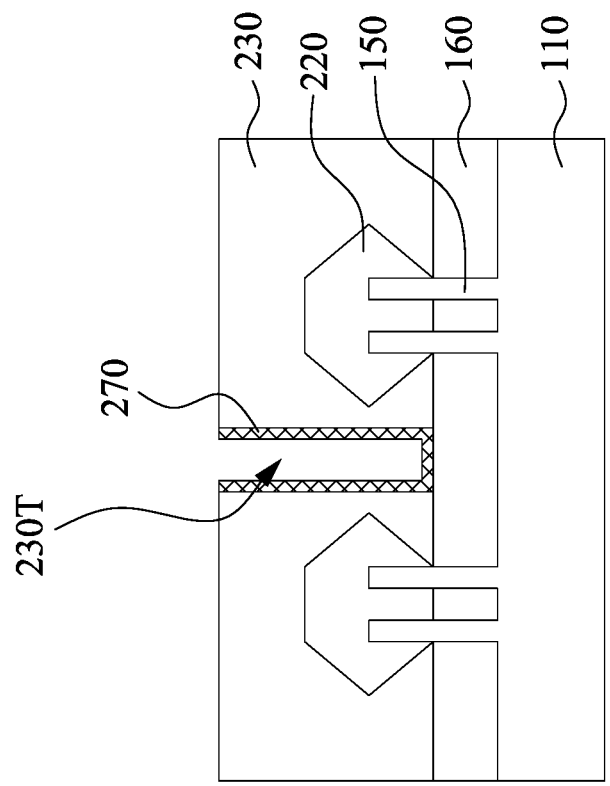
Figure 16A:
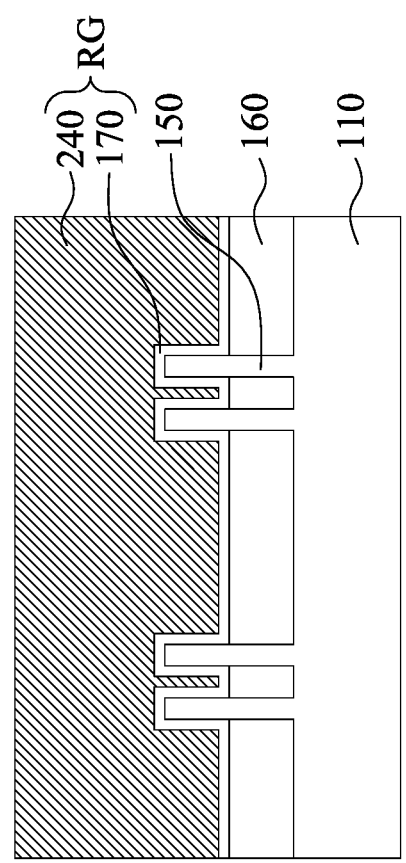

Reference is made to FIGS. 16A and 16B, where the cross-sectional position of FIG. 16A is the same as the cross-sectional position of FIG. 13B, and the cross-sectional position of FIG. 16B is the same as the cross-sectional position of FIG. 13C. A CMP process is performed to the structure shown in FIGS. 15A and 15B. Through the CMP process, the pad layer 250, the hard mask layer 260, and a portion of the helmet layer 270 outside the trench 230T are removed.

Figure 17B:
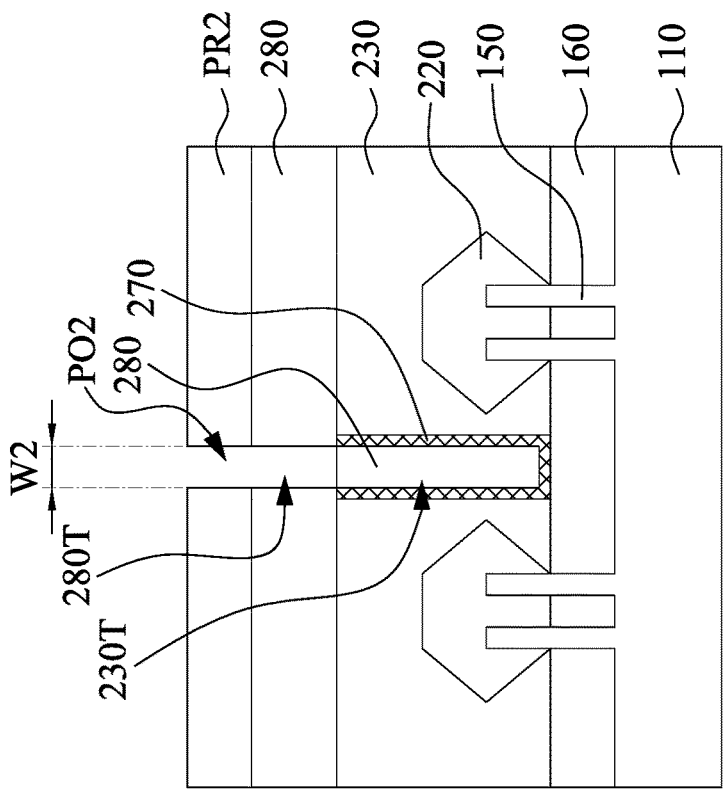
Figure 17A:
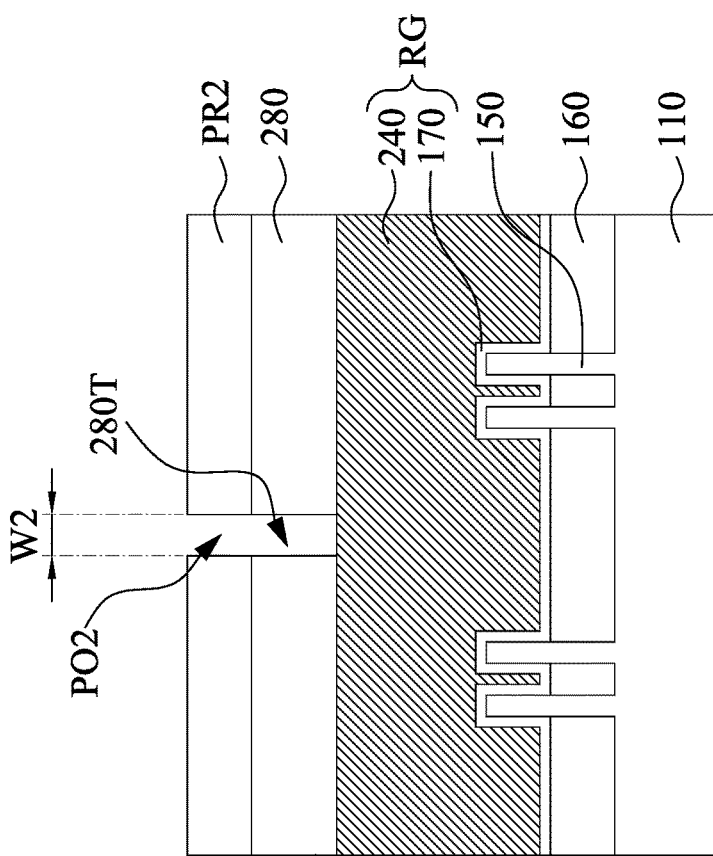

Reference is made to FIGS. 17A and 17B, where the cross-sectional position of FIG. 17A is the same as the cross-sectional position of FIG. 13B, and the cross-sectional position of FIG. 17B is the same as the cross-sectional position of FIG. 13C. Herein, a patterned hard mask layer 280 is formed over the structure shown in FIGS. 16A and 16B, with a patterned photo-sensitive PR2 thereon. The hard mask layer 280 fills the trench 230T and is thus embedded in the helmet layer 270. The photo-sensitive layer PR2 is patterned to define a position where a cut metal gate (CMG) dielectric is to be formed. To be specific, a blanket layer of hard mask material is etched using the patterned photosensitive layer PR2 as etch mask, resulting in the hard mask layer 280 having a trench 280T exposing the replacement gate structure RG and a portion of the hard mask layer 280 embedded in the helmet layer 270.

Herein, the opening PO2 of the photo-sensitive layer PR2 to define the CMG dielectric position is smaller than the opening PO1 of the photo-sensitive layer PR1 to define the position of the helmet layer 270 (as shown in FIGS. 13A-13C). To be specific, a width W2 of the opening PO2 of the photo-sensitive layer PR2 is less than a width W1 of the opening PO1 of the photo-sensitive layer PR. For example, the width W2 of the opening PO2 is less than the width W1 of the opening PO1 by a thickness of the helmet layer, for example, 2 to 10 nanometers. The width W2 of the opening PO2 is thus controlled in such a way that the helmet layer 270 is free from exposed by the opening PO2. As a result, the helmet layer 270 will not be intentionally etched by the following CMG process, which will improve the protection for the epitaxial source/drain structures 220 against the CMG process.

Figure 18B:
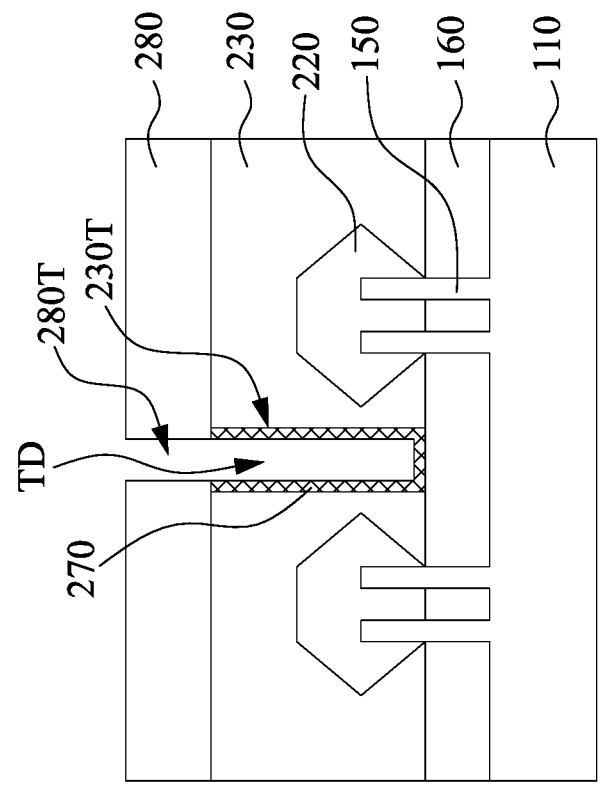
Figure 18A:
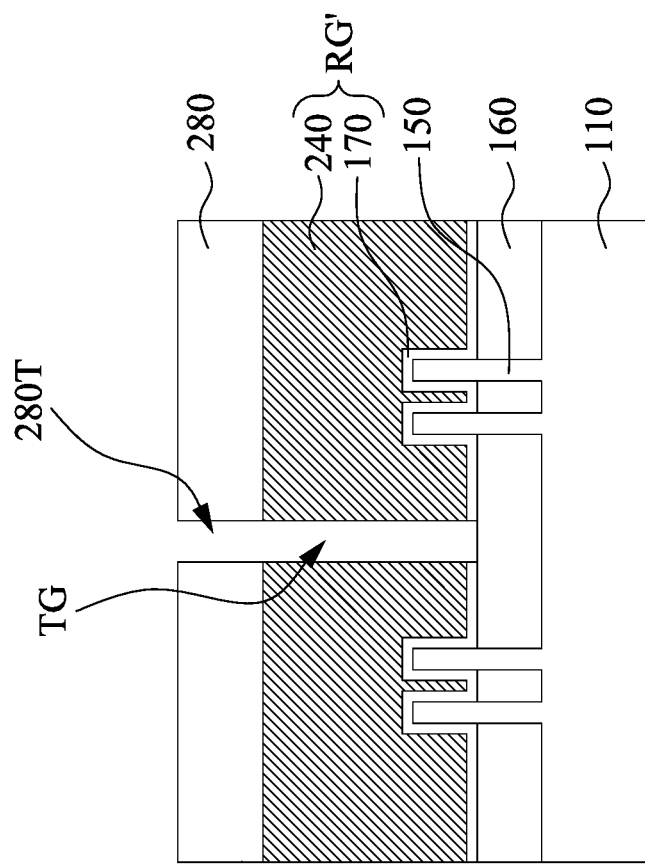

Reference is made to FIGS. 18A and 18B, where the cross-sectional position of FIG. 18A is the same as the cross-sectional position of FIG. 13B, and the cross-sectional position of FIG. 18B is the same as the cross-sectional position of FIG. 13C. A CMG process is performed to the gate structures RG through the opening PO2 of the photo-sensitive layer PR2 (referring to FIGS. 17A and 17B), such that a trench TG is formed to cut the gates structure RG into gates structures RG'. The CMG process performed to the gate structure RG may include a wet etch, a dry etch, and/or a combination thereof. Etchants used in the CMG process may be different from that used in the etching process as illustrated in FIGS. 14A and 14B. As an example, a promising candidate for performing the CMG process includes an etchant gas with heavy molecular weight compared with the etchant gas used in the etching process as illustrated in FIGS. 14A and 14B. For example, a dry etching process used in the CMG process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etchant gas with heavy molecular weight would increase undesired lateral etching to the ILD layer 230, which would lead to undesired damage to the epitaxial source/drain structures 220. However, since an additional helmet layer 270 lines the sidewalls of the trench 230T, the helmet layer 270 can protect the ILD layer 230 and the epitaxial source/drain structures 220 from the etchant gas with heavy molecular weight, which in turn will be advantageous to prevent the damage to the epitaxial source/drain structures 220 resulting from the CMG process.

In greater detail, the etching process removes the portion of hard mask layer 280 embedded in the helmet layer 270 through the opening PO2 of the photo-sensitive layer PR2, resulting in a trench TD formed in the helmet layer 270 and between the epitaxial source/drain structures 220. Herein, the etch resistance of the helmet layer 270 to the etching process is higher than that of the ILD layer 230. Therefore, the helmet layer 270 protects the ILD layer 230 from being damaged during forming the trenches TG and TD. In some embodiments, the etch resistance of the helmet layer 270 is higher than an etch resistance of the hard mask layer 280 to the etching. Herein, the trench TG is in communication with the trench TD. A combined trench of the trenches TG and TD separates the replacement gate structures RG' from each other and separates the epitaxial source/drain structures 220 from each other. In some embodiments, after etching the replacement gate structure RG, the photo-sensitive layer PR2 (referring to FIGS. 17A and 17B) may be removed using, for example, ashing.

Figure 19A:
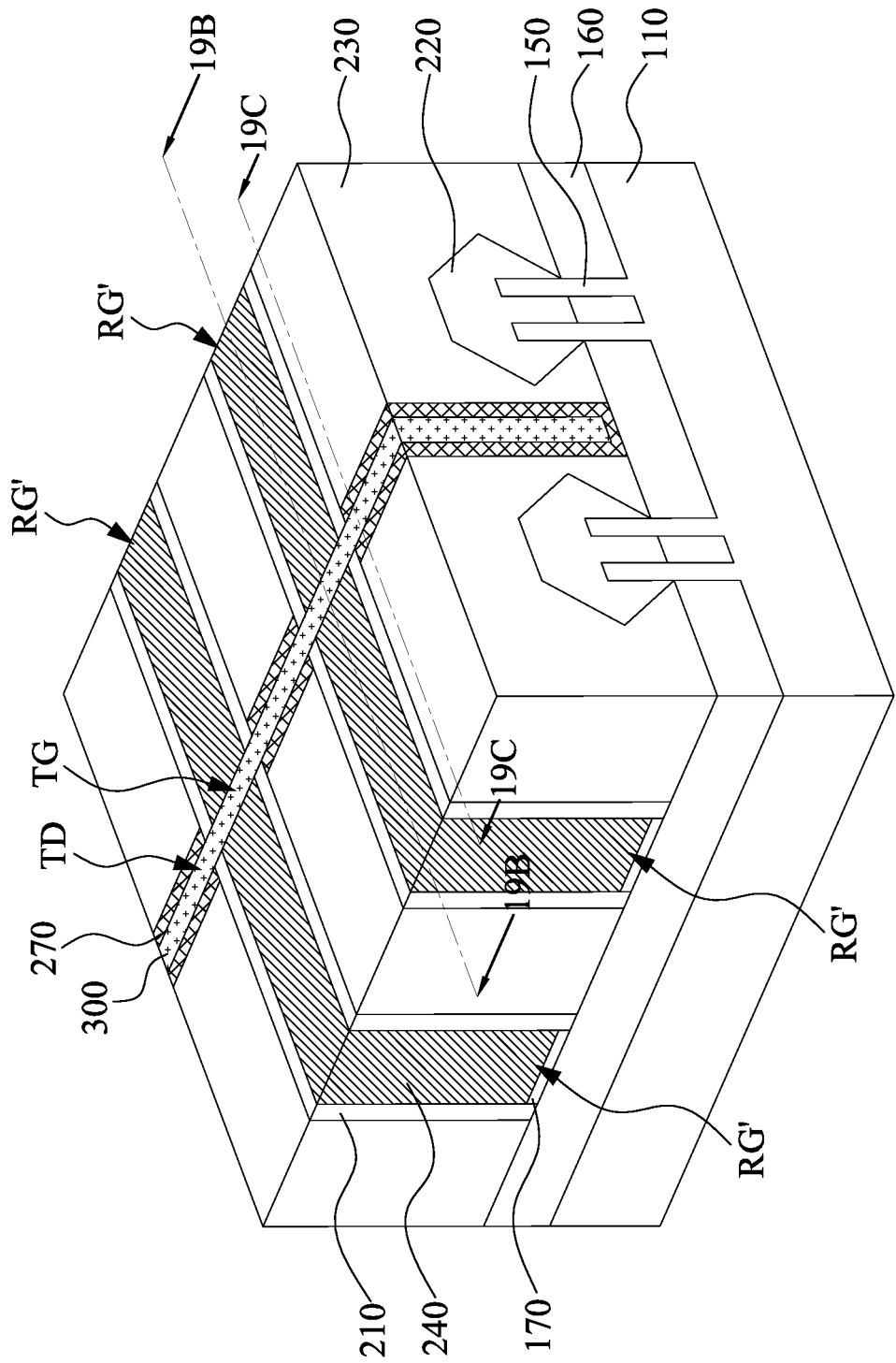
Figure 19C:
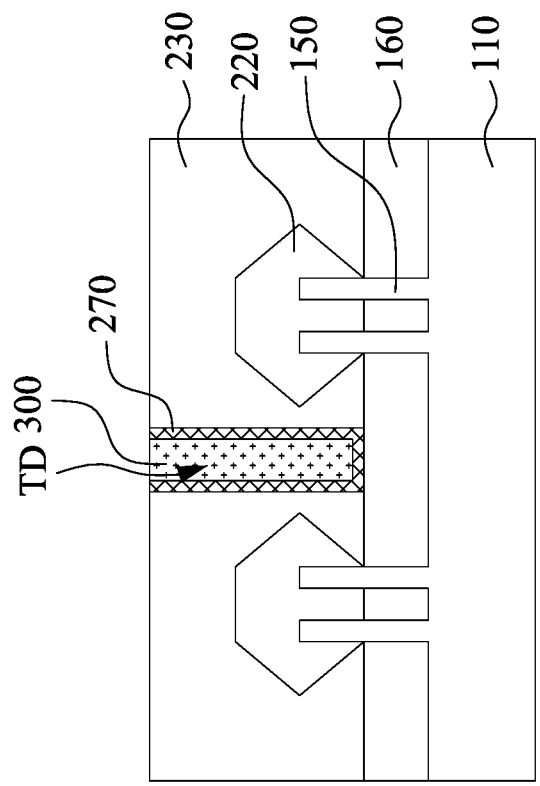
Figure 19B:
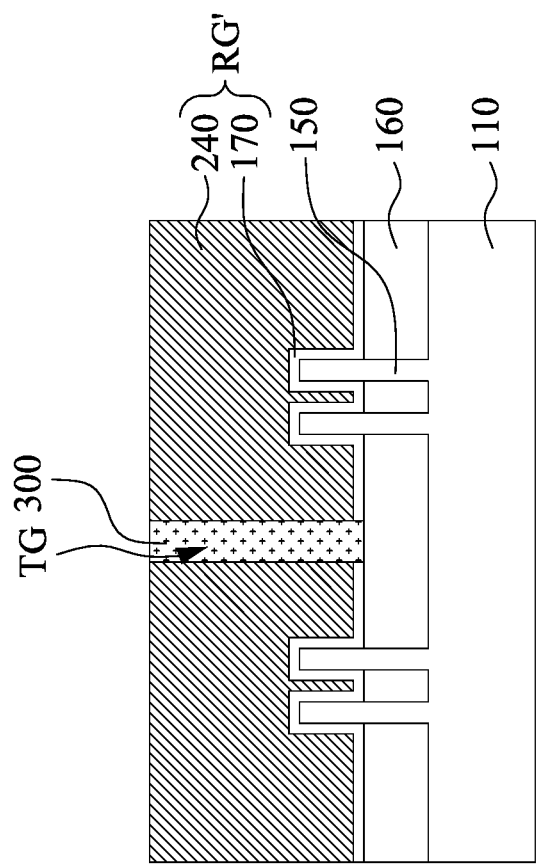

Reference is made to FIGS. 19A to 19C, where FIG. 19A is a schematic view of the semiconductor device according with some embodiments, FIG. 19B is a cross-sectional view taking along line 19B-19B of FIG. 19A, and FIG. 19C is a cross-sectional view taking along line 19C-19C of FIG. 19A. A dielectric material fills the trenches TG and TD to form a dielectric feature 300 between the gates structures RG' and between the epitaxial source/drain structures 220. The dielectric material may be deposited by CVD, ALD, spin-on coating, or other suitable techniques. The dielectric material may include silicon oxide, silicon nitride, oxynitride, a dielectric material having a dielectric constant (k) lower than thermal silicon oxide (therefore referred to as low-k dielectric material layer), and/or other suitable dielectric material layer. The dielectric material may be different from that of the helmet layer 270. A CMP may be performed to polish back the dielectric material hereby provide a substantially planar top surface of the dielectric feature 300 with respect to the gates structures RG. As a result, the gate structure lines (e.g., the gate structures RG) are cut into the gate structures RG', and separated by the CMG dielectric (e.g., the dielectric feature 300).

The dielectric feature 300 does not overlap the fins 150. For example, the dielectric feature 300 extends along the direction that the fins 150 extend along. That is, the dielectric feature 300 has a longitudinal axis in parallel with that of the fins 150. Herein, the helmet layer 270 is not between the dielectric feature 300 and the gate structures RG'. For example, the dielectric feature 300 may be in contact with the gate structures RG' without the helmet layer 270 interposed therebetween. In some embodiments, the helmet layer 270 is not between the dielectric feature 300 and the gate spacers 210. For example, the dielectric feature 300 may be in contact with the gate spacers 210 without the helmet layer 270 interposed therebetween. Herein, the helmet layer 270 extends from an edge of one gate spacer 210 adjacent to one gate structure RG' to an edge of another gate spacer 210 adjacent to another gate structure RG'.

Figure 20B:
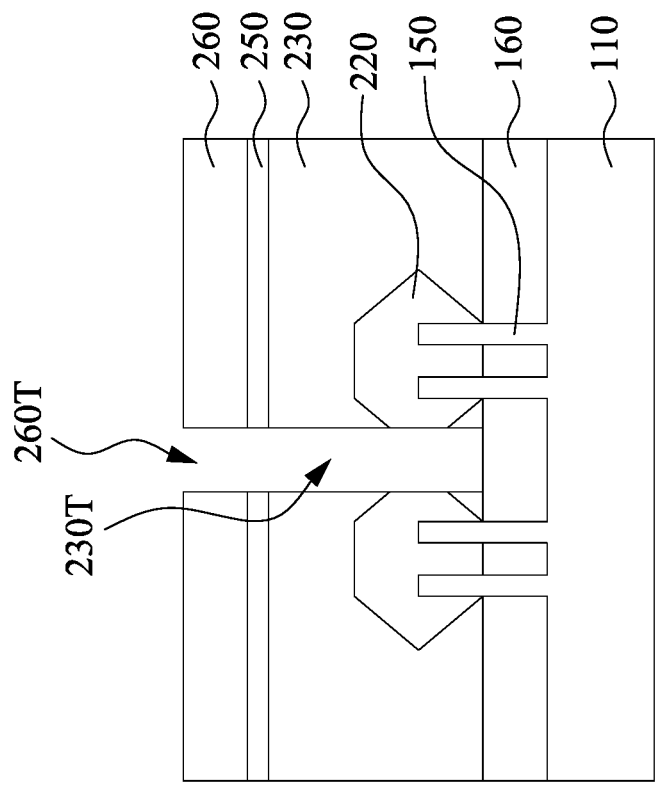
FIG. 20A to FIG. 22C illustrate a method for manufacturing a semiconductor device at various stages in accordance with some embodiments of the present disclosure.
Figure 20A:
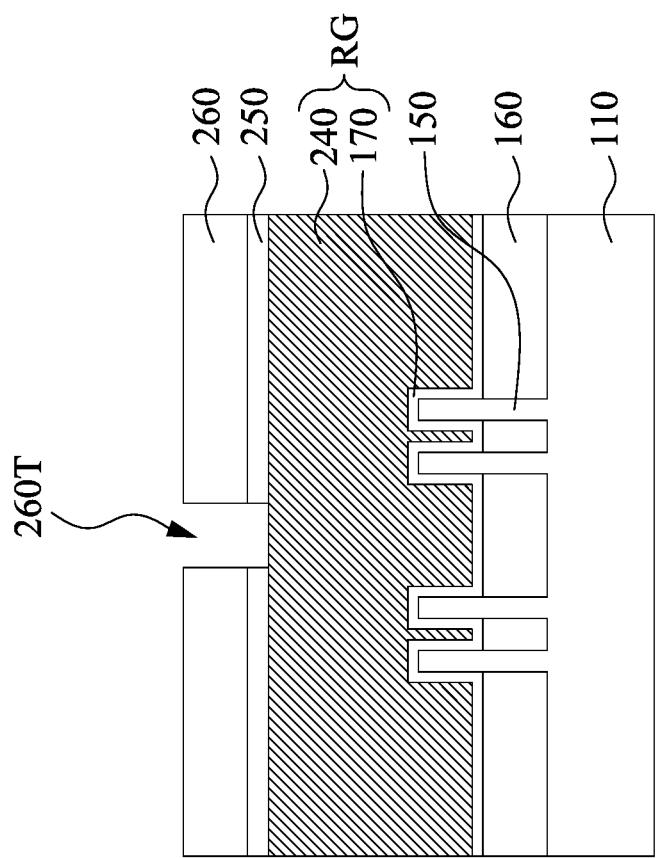

FIGS. 20A to 22C illustrate a method for manufacturing a semiconductor device at various stages in accordance with some embodiments of the present disclosure. FIGS. 20A and 20B are at the stage similar to that of FIGS. 14A and 14B, where the trench 230T is formed in the ILD layer 230. The difference between the present embodiment and the embodiment of FIG. 14A and FIG. 14B is that: the trenches 230T formed in the ILD layer 230 exposes the epitaxial source/drain structures 220. Herein, a portion of the epitaxial source/drain structures 220 are etched during forming the trenches 230T, and therefore epitaxial source/drain structures 220 include substantially vertical facets exposed by the trenches 230T. Other details of the present embodiments are similar to those aforementioned, and not repeated herein.

Figure 21B:
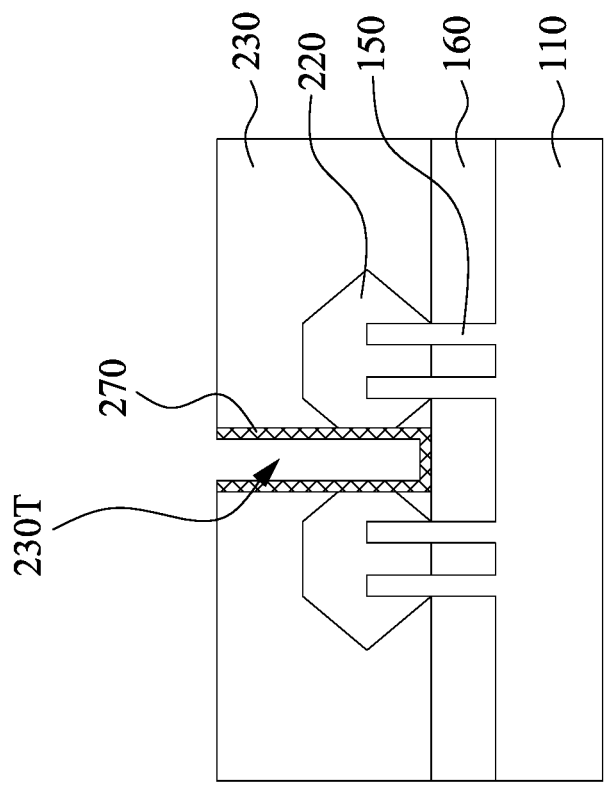
Figure 21A:
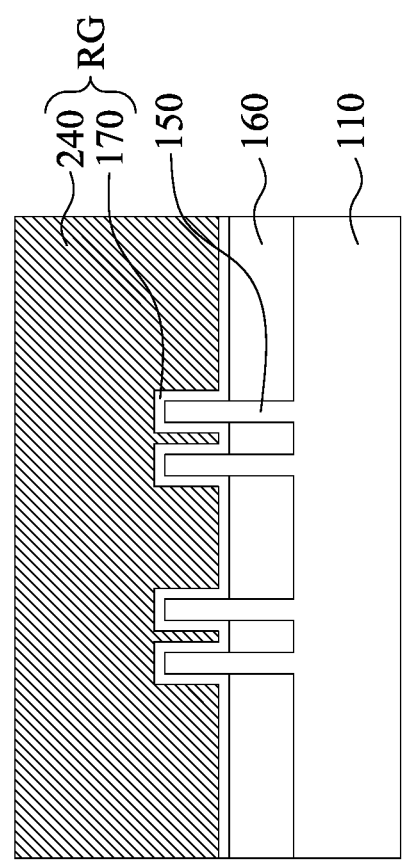

Reference is made to FIGS. 21A and 21B, which are at the stage similar to that of FIGS. 16A and 16B. The helmet layer 270 is blankly formed and a CMP process is performed to remove a portion of the helmet layer 270 outside the trench 230T. Herein, the helmet layer 270 covers exposed surfaces of the epitaxial source/drain structures 220. The helmet layer 270 may be in contact with the epitaxial source/drain structures 220 without the ILD layer 230 interposed between. Other details of the present embodiments are similar to those aforementioned, and not repeated herein.

Figure 22A:
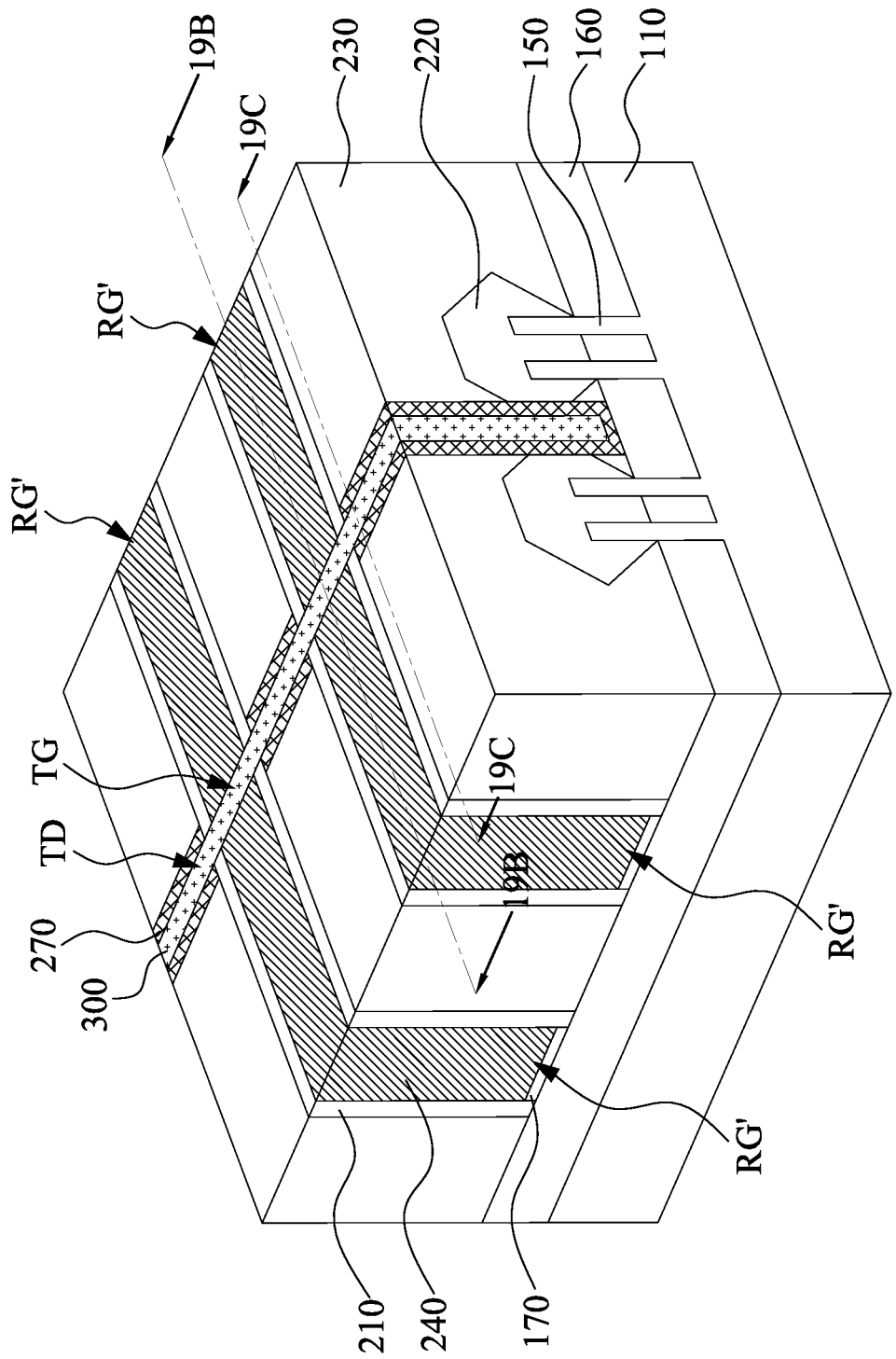
Figure 22C:
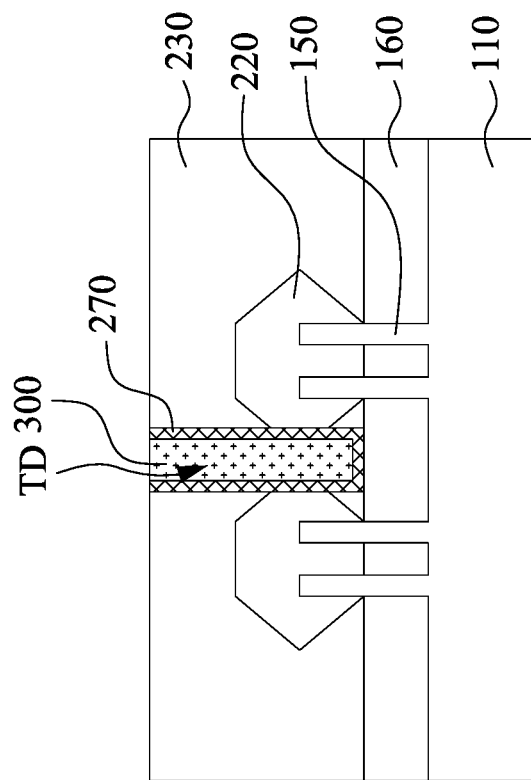
Figure 22B:
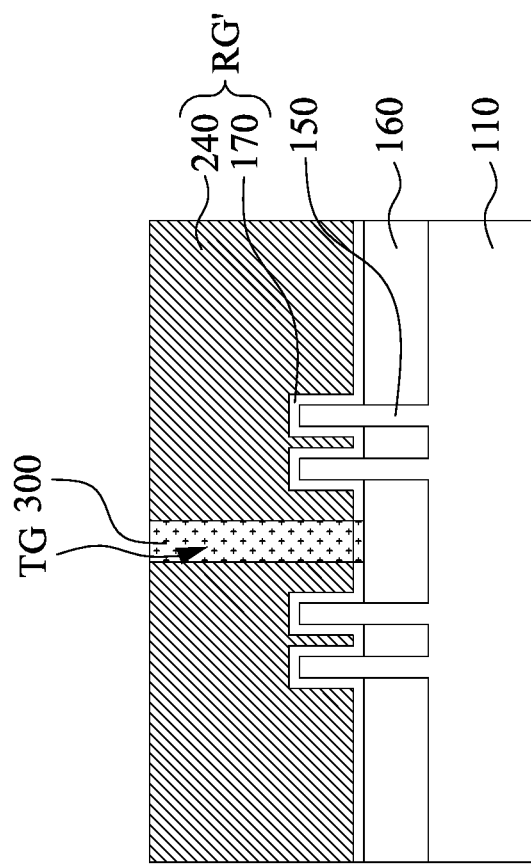

Reference is made to FIGS. 22A-22C, which are at the stage similar to that of FIGS. 19A-19C. The dielectric material fills the trenches TG and TD to form a dielectric feature 300 between the gates structures RG' and between the epitaxial source/drain structures 220. The helmet layer 270 separates the epitaxial source/drain structures 220 from the dielectric feature 300. Other details of the present embodiments are similar to those aforementioned, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the helmet layer protects the epitaxial source/drain structures from damage resulting from the CMG process. Another advantage is that the process window for the trench where the CMG dielectric is to be formed is increased. Yet another advantage is that the merged epitaxial materials respectively grown from separate fins can be formed in an increased size, because the merged epitaxial materials can be protected from the CMG process by the helmet layer.

According to some embodiments of the present disclosure, a method of forming a semiconductor device includes forming a gate structure over first and second fins over a substrate; forming an interlayer dielectric layer surrounding first and second fins; etching a first trench in the interlayer dielectric layer between the first and second fins uncovered by the gate structure; forming a helmet layer lining the first trench; and forming a dielectric feature in the first trench.

According to some embodiments of the present disclosure, a method of forming a semiconductor device includes forming a gate structure across a plurality of first portions of first and second fins over a substrate; forming an interlayer dielectric layer surrounding a plurality of second portions of the first and second fins; etching a first trench in the interlayer dielectric layer between the second portions of the first and second fins; forming a helmet layer in the first trench; etching a second trench in the gate structure between the first portions of the first and second fins after forming the helmet layer, wherein the helmet layer has a higher etch resistance to the etching than that of the interlayer dielectric layer; and filling the first trench and the second trench with a dielectric feature.

According to some embodiments of the present disclosure, a method of forming a semiconductor device includes forming a dummy gate structure across first and second fins over a substrate; forming source/drain epitaxy structures on the first and second fins; forming an interlayer dielectric (ILD) layer over the source/drain epitaxy structures; replacing the dummy gate structure with a metal gate structure; after replacing the dummy gate structure with the metal gate structure, etching the interlayer dielectric layer to form a first trench between the source/drain epitaxy structures; after etching the interlayer dielectric layer is complete, etching the metal gate structure to form a second trench communicated with the first trench; and forming a dielectric strip extending in the first trench and the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a gate structure over first and second fins over a substrate;
   forming an interlayer dielectric layer surrounding the first and second fins;
   etching a first trench in the interlayer dielectric layer between the first and second fins uncovered by the gate structure;
   forming a helmet layer lining the first trench after etching the first trench in the interlayer dielectric layer; and
   forming a dielectric feature in the first trench.

2. The method of claim 1, wherein forming the dielectric feature is performed such that the helmet layer separates the dielectric feature from the interlayer dielectric layer.

3. The method of claim 1, further comprising:
   forming an isolation dielectric between the first and second fins before the forming the gate structure, wherein etching the first trench is performed until reaching the isolation dielectric.

4. The method of claim 1, further comprising:
   forming first and second source/drain features over the first and second fins uncovered by the gate structure before forming the interlayer dielectric layer.

5. The method of claim 4, wherein etching the first trench in the interlayer dielectric layer further exposes the first and second source/drain features.

6. The method of claim 4, wherein forming the dielectric feature is performed such that the helmet layer separates the dielectric feature from the first and second source/drain features.

7. The method of claim 1, further comprising:
   etching a second trench in the gate structure such that the second trench is in communication with the first trench in the interlayer dielectric layer, wherein the helmet layer has a higher etch resistance to etching the second trench in the gate structure than that of the interlayer dielectric layer.

8. The method of claim 1, wherein forming the helmet layer in the first trench comprises:
   conformally depositing the helmet layer over the gate structure and the interlayer dielectric layer; and
   removing a portion of the helmet layer outside of the first trench.

9. The method of claim 1, wherein the helmet layer is spaced apart from the gate structure.

10. A method of forming a semiconductor device, comprising:
    forming an isolation dielectric between a plurality of first and second fins over a substrate;
    forming a gate structure across a plurality of first portions of the plurality of first and second fins;
    forming an interlayer dielectric layer surrounding a plurality of second portions of the plurality of first and second fins;
    etching a first trench in the interlayer dielectric layer between the second portions of the plurality of first and second fins;
    forming a helmet layer in the first trench;
    etching a second trench in the gate structure between the first portions of the first and second fins after forming the helmet layer, wherein the helmet layer has a higher etch resistance to the etching than that of the interlayer dielectric layer; and filling the first trench and the second trench with a dielectric feature, wherein the dielectric feature is separated from the isolation dielectric by the helmet layer.

11. The method of claim 10, wherein etching the first trench is performed such that the gate structure remains continuously surrounding the first portions of the plurality of first and second fins.

12. The method of claim 10, wherein etching the second trench is performed such that the helmet layer is exposed.

13. The method of claim 10, further comprising:
forming first and second source/drain features over the second portions of the plurality of first and second fins respectively.

14. The method of claim 13, wherein filling the first trench and the second trench with the dielectric feature is performed such that the dielectric feature is separated from the first and second source/drain features by the helmet layer.

15. The method of claim 10, wherein forming the helmet layer is performed such that the helmet layer is not formed between the first portions of the plurality of first and second fins.

16. The method of claim 10, wherein the first trench is spaced apart from the gate structure.

17. A method of forming a semiconductor device, comprising:

forming a dummy gate structure across first and second fins over a substrate;

forming source/drain epitaxy structures on the first and second fins;

forming an interlayer dielectric (ILD) layer over the source/drain epitaxy structures;

replacing the dummy gate structure with a metal gate structure;

after replacing the dummy gate structure with the metal gate structure, etching the interlayer dielectric layer to form a first trench directly between the source/drain epitaxy structures;

after etching the interlayer dielectric layer is complete, etching the metal gate structure to form a second trench communicated with the first trench; and forming a dielectric strip extending in the first trench and the second trench.

18. The method of claim 17, further comprising:
forming a helmet layer in the first trench prior to etching the metal gate structure to form the second trench.

19. The method of claim 18, further comprising:
removing a portion of the helmet layer on the metal gate structure prior to etching the metal gate structure.

20. The method of claim 17, wherein a first portion of the dielectric strip in the first trench is in direct contact with a second portion of the dielectric strip in the second trench.

* * * * *